United States Patent [19]
Nishi

[11] Patent Number: 5,674,651
[45] Date of Patent: Oct. 7, 1997

[54] ALIGNMENT METHOD FOR USE IN AN EXPOSURE SYSTEM

[75] Inventor: Kenji Nishi, Kanagawa-ken, Japan

[73] Assignee: Nikon Corporation, Tokyo, Japan

[21] Appl. No.: 534,037

[22] Filed: Sep. 26, 1995

[30] Foreign Application Priority Data

| Sep. 27, 1994 | [JP] | Japan | 6-231251 |
| Oct. 18, 1994 | [JP] | Japan | 6-252244 |
| Apr. 10, 1995 | [JP] | Japan | 7-083576 |

[51] Int. Cl.$^6$ ............................ G03F 9/00
[52] U.S. Cl. ............................ 430/22
[58] Field of Search ............... 430/22; 356/400, 356/401

[56] References Cited

U.S. PATENT DOCUMENTS

| 4,780,617 | 10/1988 | Umatate et al. | 250/548 |
| 4,833,621 | 5/1989 | Umatate et al. | 364/491 |
| 4,962,318 | 10/1990 | Nishi | 250/548 |
| 5,493,402 | 2/1996 | Hirukawa | 356/400 |

*Primary Examiner*—S. Rosasco
*Attorney, Agent, or Firm*—Armstrong, Westerman, Hattori, McLeland & Naughton

[57] ABSTRACT

An alignment method for aligning a plurality of areas on a substrate with predetermined positions, comprising the steps of (1) measuring the array coordinates of n sample shots where an initial value of n is N, and obtaining three times the standard deviation of the nonlinear error components by processing the results of the measurement; (2) calculating an evaluation value $A_n$ by dividing the value obtained in the step (1) by a predetermined function; (3) for (n−1) sample shots which are obtained by removing a sample shot in which the nonlinear error component is largest, obtaining an evaluation value $A_{n-1}$ from three times the standard deviation of the nonlinear error components, and hereinafter in the same way subsequently removing sample shots in which the nonlinear error component is large and calculating evaluation values $A_{n-2}$, $A_{n-3}$, . . . ; and (4) removing a sample shot in which the nonlinear error component is largest, as a jump shot, in a range where the evaluation value $A_n$ is larger than an average value $<A_n>$ of the calculated evaluation values.

22 Claims, 22 Drawing Sheets

Fig. 1(b)    ALIGNMENT ERROR

|  | X | Y |
|---|---|---|
| NUMBER OF MEASUREMENT | 8 | 8 |
| AVERAGE VALUE (μm) | 0.052 | -0.031 |
| 3 σ (μm) | 0.063 | 0.058 |
| SCALING (ppm) | -0.08 | -0.25 |
| w. θ (μrad) | -0.12 | 0.12 |

Fig. 1(c)    LINEAR ERROR

|  | X | Y |
|---|---|---|
| 3 σ (μm) | 0.009 | 0.031 |

Fig. 1(d)    NONLINEAR ERROR

|  | X | Y |
|---|---|---|
| 3 σ (μm) | 0.062 | 0.049 |

0.05 μm

Fig. 3(b) ALIGNMENT ERROR

|  | X | Y |
|---|---|---|
| NUMBER OF MEASUREMENT | 8 | 8 |
| AVERAGE VALUE (μm) | 0.066 | −0.008 |
| 3 σ (μm) | 0.118 | 0.189 |
| SCALING (ppm) | 0.37 | 0.50 |
| w. θ (μrad) | −1.33 | 0.87 |

Fig. 3(c) LINEAR ERROR

|  | X | Y |
|---|---|---|
| 3 σ (μm) | 0.065 | 0.111 |

Fig. 3(d) NONLINEAR ERROR

|  | X | Y |
|---|---|---|
| 3 σ (μm) | 0.098 | 0.152 |

0.05 μm

Fig. 10(b) ALIGNMENT ERROR

|  | X | Y |
|---|---|---|
| NUMBER OF MEASUREMENT | 32 | 32 |
| AVERAGE VALUE (μm) | 0.056 | -0.027 |
| 3 σ (μm) | 0.224 | 0.195 |
| SCALING (ppm) | 1.08 | 1.82 |
| w. θ (μrad) | -1.84 | -0.01 |

Fig. 10(c) LINEAR ERROR

|  | X | Y |
|---|---|---|
| 3 σ (μm) | 0.207 | 0.175 |

Fig. 10(d) NONLINEAR ERROR

|  | X | Y |
|---|---|---|
| 3 σ (μm) | 0.083 | 0.085 |

0.05 μm

ALIGNMENT ERROR

|  | X | Y |
|---|---|---|
| NUMBER OF MEASUREMENT | 31 | 31 |
| AVERAGE VALUE (μm) | 0.051 | -0.033 |
| 3 σ (μm) | 0.213 | 0.175 |
| SCALING (ppm) | 1.05 | 1.70 |
| w. θ (μrad) | -1.73 | -0.05 |

Fig. 12(c)    LINEAR ERROR

|  | X | Y |
|---|---|---|
| 3 σ (μm) | 0.200 | 0.165 |

Fig. 12(d)  NONLINEAR ERROR

|  | X | Y |
|---|---|---|
| 3 σ (μm) | 0.073 | 0.059 |

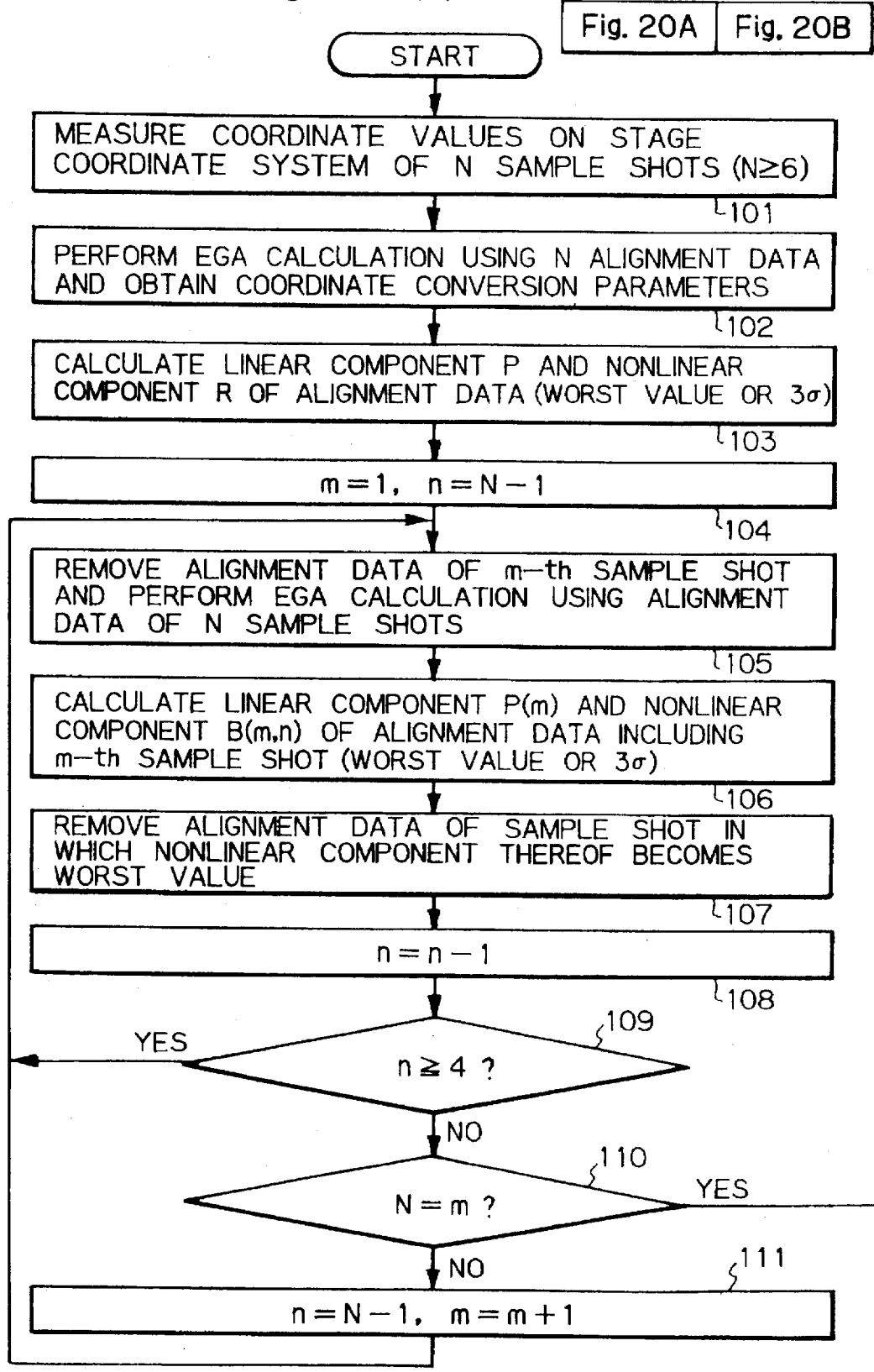

| Fig. 22 |
|---|
| Fig. 22A |
| Fig. 22B |

ALIGNMENT METHOD FOR USE IN AN EXPOSURE SYSTEM

BACKGROUND OF THE INVENTION

1. Field of the Invention

The present invention relates to an alignment method particularly adapted to the case where, in an exposure apparatus such as a stepper which is used when semiconductor devices or liquid crystal display devices are fabricated in a photolithographic process and which transfers patterns of geometric shapes on a reticle (or photomask) onto each of shot areas on a wafer (or glass plate) coated with a photosensitive material and exposes each shot area with the pattern, the shot areas on the wafer are sequentially aligned in the exposure position based on the array coordinates calculated by a statistical process.

2. Description of the Related Art

When semiconductor devices or liquid crystal display devices are fabricated in a photolithographic process, there are employed projection exposure apparatuses which transfer patterns of geometric shapes existing on a photomask or reticle (reticle will hereinafter be used as an example) onto each of shot areas on a wafer coated with a photosensitive material via a projection optical system. With this kind of projection exposure apparatus, there has been widely used a step-and-repeat type exposure apparatus, particularly an exposure apparatus of a reduction projection type (stepper) in which a wafer is placed on a stage movable in two dimensions and is stepped with this stage, and which repeats an operation in which patterns on a reticle are sequentially transferred onto each of shot areas on the wafer.

A semiconductor device is fabricated, for example, by forming a great number of circuit pattern layers on the wafer by exposure. Therefore, when the second circuit pattern layer and the subsequent layers are projected and exposed, it is necessary for the alignment between previously formed patterns on the shot areas on the wafer and successive reticle patterns, i.e., the alignment between the wafer and the reticle, to be performed accurately. A conventional wafer alignment in a stepper has been performed by an enhancement global alignment (hereinafter referred to as "EGA") method which is disclosed in, for example, Japanese Laid-Open Patent Publication No. 61-44429 (U.S. Pat. No. 4,780, 617).

That is, a plurality of shot areas (chip patterns) each having an alignment mark called a wafer mark are formed on the wafer, and these shot areas are regularly arrayed based on the array coordinates previously set on the wafer. However, even if the wafer were stepped based on the designed array coordinate values (shot array) of the shot areas on the wafer, the wafer would not be positioned accurately at all times for parameters as follows:

(1) Residual angular rotational error of a wafer (rotation θ)

(2) Orthogonal degree error, w, of stage coordinates (or shot array)

(3) Linear expansion and contraction of a wafer (scaling Rx, Ry)

(4) Offset (parallel movement) of a wafer (center position), Ox and Oy

The coordinate transformation of a wafer based on these four quantities of error (six parameters) can be expressed by an equation representing linear transformation. Then, the linear transformation, where the coordinates (x, y) on the wafer in which a plurality of shot areas each having a wafer mark are regularly arranged are transformed to the coordinates (X, Y) on the stage as stationary coordinates, can be expressed with these six parameters as follows, if the absolute values of the angle θ and the orthogonal angle error, w, are assumed to be small and approximation is made.

$$\begin{bmatrix} X \\ Y \end{bmatrix} = \begin{bmatrix} Rx & -Rx(w+\theta) \\ Ry\theta & Ry \end{bmatrix} \begin{bmatrix} x \\ y \end{bmatrix} + \begin{bmatrix} Ox \\ Oy \end{bmatrix} \quad (1)$$

$$= \begin{bmatrix} a & b \\ c & d \end{bmatrix} \begin{bmatrix} x \\ y \end{bmatrix} + \begin{bmatrix} e \\ f \end{bmatrix}$$

The six parameters, Rx, Ry, θ, w, Ox, and Oy (more precisely, parameters a to f), in this equation can be obtained by EGA as follows. In this case, the wafer marks, where the designed coordinates of the coordinate system (x, y) corresponding to of the some shot areas (sample shots) selected from the exposure shot areas (chip patterns) on the wafer are $(x_1, y_1)$, $(x_2, y_2)$, . . . , and $(x_n, y_n)$, are aligned with predetermined reference positions. Then, the actual coordinate values $(XM_1, YM_1)$, $(XM_2, YM_2)$, . . . , and $(XM_n, YM_n)$ on the stage coordinate system (X, Y) of the wafer marks at that time are measured.

Also, there is a difference $(\Delta x_i, \Delta y_i)$ (i=1, 2, . . . , and N) between the calculated array coordinates $(X_i, Y_i)$ obtained by substituting the designed array coordinates $(x_i, y_i)$ of the selected wafer marks into the above-described linear transformation model and the coordinates $(XM_i, YM_i)$ measured at the time of the above-described alignment, and this difference is considered to be an alignment error. Then, the sum of squared alignment errors is considered to be a residual error component, as shown in the following equation, and the values of the six parameters (a to f) are determined so that the residual error component becomes minimum.

$$\text{Residual error component} = \sum_{i=1}^{N} \{(X_i - XM_i)^2 + (Y_i - YM_i)^2\} \quad (2)$$

More specifically, the six parameters (a to f) will be obtained if the residual error component is partially differentiated in sequence with six parameters and six equations are made so that the value becomes 0, and then six simultaneous equations are solved. The calculation where six parameters of Equation (1) are thus obtained by a least squares method is called an EGA calculation. After this, the alignment of each shot area on the wafer can be performed based on the array coordinates calculated with the equation (1) representing linear transformation, where the six parameters are coefficients.

For example, FIG. 1(a) shows an example of eight sample shots $SA_1$ to $SA_8$ on the wafer and the vectors $V_1$ to $V_8$ of the alignment errors on these sample shots, and each of the vectors $V_1$ to $V_8$ is a vector obtained by subtracting the desired coordinates from the measured coordinates. Also, FIG. 1 (b) shows the number of measured sample shots, the average values of the X and Y components of an alignment error, three times the standard deviations of the X and Y components (3σ), the errors of the scalings Rx and Ry of the X and Y components from 1 representing linear errors, the orthogonal angle errors w of the X and Y components, and the values of the rotations θ of the X and Y components.

Also, FIG. 1(c) shows the value (3σ) of three times the standard deviation of the linear error in each of the X and Y directions which are obtained for each sample shot with the parameters Rx, Ry, w, θ, Ox, and Oy. FIG. 1(d) shows the value (3σ) of three times the standard deviation of the nonlinear error in each of the X and Y directions which are obtained for each sample shot. The linear error of FIG. 1(c)

is an error vector that is obtained by subtracting the calculative coordinates ($X_i$, $Y_i$) calculated from Equation (1) from the coordinates (XMi, YMi) actually measured on the stage coordinate system. The nonlinear error of FIG. 1(d) is an error vector that is obtained by subtracting the calculated coordinates ($X_i$, $Y_i$) calculated from Equation (1) from the coordinates ($XM_i$, $YM_i$) actually measured on the stage coordinate system.

In this case, the vectors $VL_1$ to $VL_8$ of the linear errors in the sample shots of FIG. 1 become as shown in FIG. 2. When a plurality of alignment error vectors do not include a vector where the absolute value is particularly greater than those of other sample shots, as shown in FIG. 1, accurate linear error vectors are obtained.

In the alignment method of the conventional EGA described above, there are some cases where a plurality of sample shots include "a jump shot" where the alignment error is particularly greater than those of other sample shots. A jump shot such as this is caused by an error in measurement resulting from damage to the wafer mark being added to that sample shot on the wafer or by a local nonlinear strain resulting from foreign substances adhering to the back surface of the wafer. Therefore, when the array coordinates of other shot areas are calculated, it is preferable for such a jump shot to be excluded.

For example, FIG. 3(a) shows another example of eight sample shots $SA_1$ to $SA_8$ on the wafer, including a jump shot, and the vectors $V_1$ to $V_8$ of the alignment errors on these sample shots. FIGS. 3(a) to 3(d) correspond to FIGS. 1(a) to 1(d). Also, in FIG. 3(a), the sample shot $SA_3$ is a jump shot, and the vector $V_3$ of the alignment error of this jump shot is particularly greater in absolute value. In this case, the linear error vectors, which are obtained by subtracting the designed coordinates ($x_i$, $y_i$) from the calculative coordinates ($X_i$, $Y_i$) calculated from Equation (1), become as shown by vectors $VL_1$ to $VL_8$ in FIG. 4. The error vector $V_3$ of FIG. 3 appears as if it were replaced with two linear error vectors $VL_3$ and $VL_6$. This means that if EGA calculation is performed including the jump shot, the linear errors of the positions of shot areas other than the jump shot area will be increased.

Also, when the alignment is actually performed, it is necessary for an operator to input the number and the positions of sample shots to the control section of the alignment system, depending upon the kind of a wafer to be processed. In this case, if there are a small number of sample shots, an averaging effect will be reduced, and on the other hand, if there are a large number of sample shots, a measuring time will become long. As a result, throughput (the number of wafers that can be exposed per hour) is reduced. Therefore, to what extent the number of sample shots is set is an important problem.

Further, in a case where, in order to exclude the jump shot a sample shot where the absolute value of the nonlinear error component is greater than a predetermined threshold value is thought of as a jump shot to be excluded as shown, for example, in U.S. patent application Ser. No. 935,424 (filed on Aug. 26, 1992) by the assignee of the present application, it is desirable that an evaluation reference for selecting a jump shot according to an actual measurement result of the array coordinates of a sample shot be automatically set to some degree, because the jump shot is changed depending upon how the threshold value is determined.

Also, there is the possibility that even if there is no jump shot, there will be a sample shot where the absolute value of the nonlinear error component is large because of the actual linear expansion or contraction of a wafer. Therefore, if a sample shot where the absolute value of the nonlinear error component is large is simply excluded as a jump shot, on the contrary there is the possibility that final alignment accuracy will be reduced.

The detection of the above-described jump shot is made as the following (1) to (3). A jump shot detected is rejected and enhancement global alignment is performed.

(1) A shot area where the alignment error is greater than a predetermined reference value is considered to be a jump shot. For example, FIG. 5(a) shows an example of the alignment errors of sample shots distributed on a wafer 41 to be exposed, on a greatly enlarged scale. In the figure, on the coordinate system (x, y) on the wafer, the designed array coordinates of the shot regions including sample shots are fixed. On the other hand, on the stage coordinate system (X, Y) which is the coordinate system of a wafer stage where the wafer 41 is placed, the coordinate values of eight sample shots $SB_1$ to $SB_8$ (accurately the coordinate values of wafer marks) are measured.

Then, the alignment errors of the eight sample shots $SB_1$ to $SB_8$ are expressed by vectors $VB_1$ to $VB_8$, respectively. For example, the start point of the vector $VB_1$ represents the center coordinates designed on the stage coordinates (X, Y) of the sample shot $SB_1$, and the end point of the vector $VB_1$ represents the center coordinates measured on the stage coordinates (X, Y) of the sample shot $SB_1$. The center coordinates designed on the stage coordinates (X, Y) in this case are calculated by substituting the approximate values of six parameters (a to f) and the designed values on the wafer coordinate system into Equation (1). The approximate values of six parameters (a to f) are obtained, for example, by global alignment where the linear expansion or contraction of the six parameters is considered to be isotropic (Rx=Ry), the orthogonal angle error w is considered 0, and the positions of two-dimensional alignment marks on the wafer 41 are measured on the stage coordinate system (X, Y).

FIG. 5 (b) shows the absolute values $|VB_1|$ to $|VB_8|$ of the vectors of the alignment errors of the eight sample shots $SB_1$ to $SB_8$ of FIG. 5(a). If the absolute value is greater than a predetermined reference value VB, then the sample shot, i.e., the second sample shot $SB_2$ will be rejected.

(2) An alignment error is divided into a linear component and a nonlinear component by performing an EGA calculation, and if the nonlinear component is greater than a predetermined reference value, the sample shot will be rejected.

FIG. 6(a) shows another example of the vectors $VB_1$ to $VB_8$ of the alignment errors of sample shots $SB_1$ to $SB_8$ on the wafer 41, and FIG. 6(b) shows the absolute values (absolute values of alignment errors) of the vectors $VB_1$ to $VB_8$ of the eight sample shots $SB_1$ to $SB_8$. In this case, with respect to the array coordinate values of each sample shot designed on the coordinate system on the wafer 41 and with respect to the coordinate values of each sample shot measured on the stage coordinate system, six parameters (a to f) which meet Equation (1) in a least squares method manner are obtained by EGA calculation. Then, the calculated array coordinate values, where the linear error on the stage coordinate system of each of the sample shots $SB_1$ to $SB_8$ is subtracted, are calculated by substituting the 6 parameters (a to f) and the designed array coordinate values into Equation (1). The vector from the first calculated array coordinates to the calculative array coordinate value in which the linear error is subtracted is a vector of the linear component of the alignment error.

And, if the vectors of the linear components are subtracted from the vectors of the alignment errors of FIG. 6(a), then nonlinear component vectors $VBN_1$ to $VBN_8$ will be obtained for the sample shots $SB_1$ to $SB_8$, respectively, as shown in FIG. 7(a). FIG. 7(b) shows the absolute values $|VBN_1|$ to $|VBN_8|$ of the nonlinear component vectors of the alignment errors of the sample shots $SB_1$ to $SB_8$. A sample shot where the absolute value of the nonlinear component is greater than a predetermined reference value, for example, the eighth sample shot $SB_8$, is rejected.

(3) A standard deviation of an absolute value of a vector of an alignment error for each sample shot on the wafer is calculated, and if the absolute value of the vector of the alignment error is greater than a predetermined number times the standard deviation, then the sample shot will be rejected.

In the prior art described above, in the above-described method (1) where a sample shot will be rejected if the absolute value of the vector of the alignment error is greater than a reference value, if the case of FIG. 4(a) is taken as an example, there will be the a problem in that the vector $VB_8$, where the direction is poor in balance when viewed from the entirety, is not rejected because the absolute value is small. Also, when the entire rotation, orthogonality, or linear expansion and contraction (scaling) of the wafer 41 is particularly large, most sample shots become an object of rejection and accurate alignment becomes impossible, unless the predetermined reference value (value corresponding to the reference value VB of FIG. 5(b)) is made considerably large. Also, depending upon the direction of the vector of an alignment error that is rejected, the nonlinear component is conversely emphasized, so a sample shot which should be rejected is often mistaken.

Next, in the above-described method (2) where a linear component is corrected by EGA calculation and the absolute value of the nonlinear component obtained is compared with a predetermined reference value, the probability that a sample shot is mistaken is greatly reduced as compared with the method (1). However, since the linear component that is calculated by the method (2) is calculated with the coordinate value of a jump shot which should be rejected, the linear component is considered to be inaccurate. Therefore, the value of the absolute value (corresponding to the distribution of FIG. 7(b)) of the nonlinear component of the alignment error finally obtained is also inaccurate, and there is the possibility that a sample shot which should be rejected will be mistaken in the vicinity of, for example, a predetermined reference value.

Also, even in the case (3) where, based on the standard deviation of the absolute value of the alignment error, a reference value of rejection is set to a statistical fluctuation value, a sample shot which should be rejected is often mistaken as in the case (1), because the linear component has not been subtracted. Further, even if the method (3) were combined with the method (2), as with case (2) there would be the possibility that a sample shot, which should be rejected in the vicinity of, for example, the reference value, is mistaken, because the combination method includes the alignment error of a sample shot which should be rejected.

SUMMARY OF THE INVENTION

A primary object of the present invention is to provide an alignment method which, when alignment is performed by a statistical processing method such as an EGA method, is capable of reducing the influence of a jump shot and setting shot areas (processing areas) on a substrate such as a wafer with a high degree of accuracy to predetermined positions, respectively.

Another object of the present invention is to provide an alignment method which is capable of automatically determining an evaluation reference for specifying a jump shot.

Still another important object of the present invention is to provide an alignment method which, when each shot region on a wafer is aligned based on the calculative array coordinates calculated with parameters obtained by a statistical process, is capable of accurately rejecting a jump shot where the nonlinear component of the alignment error is large from among sample shots and performing alignment with a high degree of accuracy.

A first alignment method according to the present invention is premised on the assumption that, when a plurality of areas to be processed or areas on a substrate are respectively aligned with predetermined processing positions within a coordinate system prescribing a moving position of the substrate, coordinate positions on the coordinate system of sample regions or areas $SA_1$, $SA_2$, . . . of more than a predetermined number selected in advance from among the plurality of areas to be processed are measured, array coordinates on the coordinate system of each of the plurality of areas to be processed on the substrate are calculated by statistically calculating the measured plurality of coordinate positions, and the plurality of processing areas to be processed are respectively aligned with the processing positions by controlling the moving position of the substrate in accordance with the calculated array coordinates.

The first alignment method, on the above-described assumption, comprises the steps of (1) measuring coordinate positions on said coordinate system of N sample areas (where N is an integer of 4 or more) selected in advance from among said plurality of areas to be processed; (2) obtaining nonlinear error components from designed positions of the coordinate positions measured in said first step and obtaining an evaluation value which is a dispersion of said nonlinear error components divided by a function of said N, for said N sample areas; (3) by excluding a sample area where a nonlinear error component thereof is largest in the step (2) and repeating said step (2) until a number of said sample areas reaches a predetermined number, obtaining an evaluation value corresponding to the number of the remaining sample areas; (4) removing a sample area in which a nonlinear error component thereof is largest in said step (2), when each of the evaluation values obtained in the steps (2) and (3) is greater than a predetermined threshold value based on said plurality of evaluation values; and (5) calculating array coordinates on said coordinate system of each of said plurality of areas to be processed on said substrate by statistically processing the coordinate positions measured in the step (1) for the sample areas left in the step (4).

In the above-described first alignment method, an example of the predetermined threshold value is an average value of said plurality of evaluation values, or a value that is obtained by adding the dispersion of said evaluation values to an average value of said plurality of evaluation values.

A second alignment method according to the present invention, on the same assumption as the first alignment method, comprises the steps of (1) measuring coordinate positions on said coordinate system of N sample areas (where N is an integer of 4 or more) selected in advance from among said plurality of areas to be processed; (2) obtaining nonlinear error components from designed positions of the coordinate positions measured in the step (1) and obtaining a dispersion of the plurality of nonlinear error components, for said N sample areas; (3) by excluding a sample area where a nonlinear error component thereof is largest in the step (2) and repeating said step (2) until the number of said sample areas reaches a predetermined number, obtaining a dispersion of nonlinear error components corresponding to the number of the remaining sample areas; (4) removing a sample area where a nonlinear error component thereof is largest in said step (2), when each of dispersions of the nonlinear error components obtained in the steps (2) and (3) is greater than a predetermined function which monotonically increases according to the number of said sample areas to be calculated; and (5) calculating array coordinates on said coordinate system of each of said plurality of processing areas on said substrate by statistically processing the coordinate positions measured in the step (1) for the sample areas left in the step (4).

In the above-described second alignment method, the number of sample areas to be calculated is n and an example of the predetermined function is a function obtained by multiplying a predetermined constant by $\{n(n-3)\}^{1/2}$.

A third alignment method according to the present invention, similar to the first alignment method, comprises the steps of (1) detecting a substrate surface condition of N sample areas (where N is an integer of 4 or more) selected in advance from among said plurality of areas to be processed and, based on the result of the detection, excluding a sample area where the surface condition is worse than a predetermined allowable value; (2) measuring coordinate positions on said coordinate system of sample areas left in the step (1); and (3) calculating array coordinates on said coordinate system of each of said plurality of areas to be processed on said substrate by statistically processing the coordinate positions measured in the step (2) for the sample areas left in said step (1).

According to the first alignment method of the present invention, the coordinate positions of N sample areas are measured and, for N sample areas, the nonlinear error components of the alignment errors of the coordinate positions are then obtained. Three times a standard deviation (NLE(3σ)), for example, is obtained as a dispersion of the N nonlinear error components. Note that instead of three times a standard deviation, the maximum value of the nonlinear error components may be used.

In this case, if the number of sample areas to be measured is generally n, the probability that a nonlinear error is considered to be a linear error will become high if the value of n becomes small. Therefore, if the value of n becomes small, then the reliability in the linear error will be reduced as shown by a function Fn (in Gaussian distribution, $F_0 \cdot (n-3)^{1/2}$) in FIG. 8. In other words, if the value of n becomes small, the value of the nonlinear error components to be measured will be small. If, on the other hand, the number of sample areas, n, becomes large, an effect of averaging will become high. Therefore, if the value of n becomes large, then accuracy of a linear error will monotonously increase as shown by a function Gn (in Gaussian distribution, $n^{1/2}$). Therefore, if an evaluation value, $A_n$, is calculated by dividing three times the standard deviation of the nonlinear error component (NLE(3σ)) by the product of functions $F_n$ and $G_n$, this evaluation value, $A_n$, will become nearly a constant value.

Next, for (N−1) sample areas excluding a sample area where a nonlinear error component thereof is largest among the N nonlinear error components, three times the standard deviation of the nonlinear error components of the alignment errors is obtained and further the evaluation value $A_{N-1}$ is obtained. Thereafter, for (N−2), (N−3), . . . sample areas obtained by excluding a sample area where a nonlinear error component thereof is largest, the evaluation values $A_{N-2}$, $A_{N-3}$, . . . are obtained in sequence in the same way. As an example, an average value $<A_n>$ of a sequence of these $A_{N-1}$, $A_{N-2}$, . . . is assumed to be a threshold value. And, with sample areas that remain at the time that the evaluation value $A_{N-i}$ has become less than the threshold value $<A_n>$, alignment is performed by an EGA method. Also, for example, the center value between the maximum value and the minimum value may be used instead of the threshold value $<A_n>$.

Note that since the dispersion of the quantity of each nonlinear error is also large when the number of sample regions, n, is small, accuracy will often tend to deteriorate if sample regions are excluded until the evaluation value becomes less than the average value $<A_n>$. Then, three times a standard deviation with respect to the number of sample areas, n, i.e., in Gaussian distribution, $<A_n>/(n-3)^{1/2}$ is obtained, as the dispersion of the average value $<A_n>$ of the evaluation value obtained by three times a standard deviation of the non-linear error component. And, with sample areas which remain at the time that the evaluation value $A_{N-i}$ has become less than ($<A_n>+<A_n>/(n-3)^{1/2}$), EGA calculation will be made.

In the above-described second alignment method of the present invention, three times the standard deviation of the nonlinear error component (NLE(3σ)) itself is compared with a threshold value $C_n$ which increases monotonically with respect to the number of sample areas, n, as shown in FIG. 7. When the NLE(3σ) is greater than the threshold value $C_n$, a sample area is excluded. With this, the same advantage as the first alignment method is obtained. Also, in Gaussian distribution the threshold value $C_n$ is $K1\{n(n-3)\}^{1/2}$ where K1 is a predetermined constant.

Also, in the above-described third alignment method of the present invention, the surface condition of a substrate, for example, the roughness condition is detected in order to find a jump shot. And, for example, a sample area where the roughness of the surface exceeds a predetermined allowable value is excluded as a jump shot. With this, a jump shot can be excluded without measuring the coordinate value of a sample area.

Furthermore, the positions of all the areas to be processed (shot areas) on the leading wafer among wafers of a lot as projection exposure is carried out may be measured in order to exclude a jump shot with the above-described first to third alignment methods. In such a case, the sample areas for the alignments of the second substrate and the subsequent substrates can be automatically selected to a suitable number and at distribution from the area to be processed left on the leading substrate.

A fourth alignment method according to the present invention is premised on the assumption that respective array coordinates on a predetermined coordinate system, prescribing a moving position of a substrate of a plurality of areas arrayed according to designed array coordinates on said substrate are obtained and, based on the obtained array coordinates, said plurality of areas to be processed are respectively aligned with corresponding processing positions.

The fourth alignment method, on the above-described assumption, comprises the steps of (1) measuring coordinate positions on said predetermined coordinate system of N sample regions (where N is an integer of 6 or more) selected in advance from among said plurality of areas to be processed; (2) statistically processing (n−1) coordinate position data in which the m-th sample area (where m is an integer of initial value 1) is excluded from the coordinate position data of n sample areas (where n is an integer of initial value N) measured in the step (1), and based on the result of the processing, obtaining nonlinear error components of respective coordinate position data which include the m-th sample area, and obtaining dispersions B(m, n−1) of the n nonlinear error components; (3) excluding a sample area in which the nonlinear error component is largest among the nonlinear error components obtained in the step (2) and obtaining (n−2) sample areas; (4) repeating the steps (2) and (3) until sample areas that are left in said step (3) reaches a predetermined lower limit value $N_{min}$ and obtaining the respective dispersions B(m, n−1) of the nonlinear error components; (5) respectively repeating the steps (2) to (4) to obtain the dispersions B(m, n−1) of the nonlinear error components and obtain values T1(m) which are obtained by standardizing the dispersions B(m, N−1) with an average value of the dispersions B(m, n−1) in a range where a variable (n−1) changes from (N−1) to $N_{min}$, while a value of said integer m is being increased from 1 to N one by one; (6) detecting a sample area in which the nonlinear component of a measurement result is large by comparison of the N values T1(m) obtained in the step (5); and (7) statistically processing said measured coordinate position data of the N sample areas which include the sampling area detected in the sixth process, and calculating the array coordinates on said predetermined coordinate system of said plurality of areas to be processed.

In the above-described fourth alignment method of the present invention, it is desirable that in the step (5), for the dispersions B(m, n−1) of the nonlinear error components there be further obtained values T2(m1, m2) (integers m1 and m2 represent the order of sample areas that have been removed at this time) which are obtained by standardizing a sum of the dispersions B(m, N−1) and B(m, N−2) with an average value of the dispersions B(m, n−1) in a range where a variable (n−1) changes from (N−2) to $N_{min}$, while a value of said integer m is being increased from 1 to N. It is also desirable that in the step (6), a sample area in which the nonlinear error component is large can be detected by comparing the N values T2(m1, m2) obtained in the step (5).

Also, it is desirable that in the step (6), a sample area in which the nonlinear error component is large be detected by comparing said N values T1(m) and said N values T2(m1, m2).

Furthermore, in the step (7), the measured coordinate position data of the sample areas in which the sample area detected as the nonlinear error component being large in the sixth process is excluded, may be statistically processed and the array coordinates on said predetermined coordinate system of said plurality of areas to be processed may be calculated.

Moreover, in the step (7), the array coordinates on said predetermined coordinate system of said plurality of areas to be processed may be calculated by respectively weighting the measured coordinate position data of said N sample areas so that the weight of the sampling area detected as the nonlinear error component being large in the step (6), becomes small and also by statistically processing the weighted coordinate position data.

When weighting is thus used, values corresponding to inverse numbers of said N values T1(m) or said N values T2(m1, m2) may be used as weights that are respectively applied to the measured coordinate position data of said N sample regions.

A fifth alignment method according to the present invention, similar to the fourth alignment method, comprises the steps of (1) measuring coordinate positions on said predetermined coordinate system of N sample areas (where N is an integer of 6 or more) selected in advance from among said plurality of areas to be processed; (2) obtaining a parameter for transforming said designed array coordinates to the array coordinates on said predetermined coordinate system by statistically processing (N−1) coordinate position data in which the m-th sample area (where m is an integer of initial value 1) is excluded from the coordinate position data of the N sample areas measured in step (1), respectively calculating array coordinates on said predetermined coordinate system of said N sample areas using the obtained parameter and said designed array coordinates, and obtaining dispersions B'(m, N−1) of nonlinear error components of the N array coordinates calculated; (3) repeating step (2) to obtain said dispersions B'(m, n−1) of the nonlinear error components, while a value of said integer m is being increased up to N one-by-one; (4) detecting a sample area where the nonlinear component of a measurement result is large by comparison of said N dispersions B'(m, N−1) of the nonlinear error components obtained in the step (2) and the step (3); and (5) statistically processing the measured coordinate position data of said N sample areas which include the sample area detected in the step (4), and calculating the array coordinates on said predetermined coordinate system of said plurality of areas to be processed.

A sixth alignment method according to the present invention, similar to the fourth alignment method, comprises the steps of (1) measuring coordinate positions on said predetermined coordinate system of N sample areas (where N is an integer of 6 or more) selected in advance from among said plurality of areas to be processed areas; (2) processing the coordinate position data of N sample areas measured in step (1) and obtaining a sample area where a nonlinear error component thereof is large, as a jump area; and (3) respectively weighting the N coordinate position data measured in step (1) so that they become small at said jump area, and calculating the array coordinates on said predetermined coordinate system of said plurality of areas to be processed by statistically processing the N coordinate position data thus weighted.

The above-described fourth alignment method of the present invention notices that the number of jump areas (jump shots) where the absolute value of the nonlinear error component thereof on a single substrate is usually one or two at most, and from sample areas on a substrate which are to be measured, the detection of the jump shots is performed as follows; namely, assume that the number of jump shots is one and that the first sample area is a jump shot.

In such a case, if the coordinate position data of the first (m=1) sample area (sample shot) is first removed and statistical processing (such as EGA calculation) is performed with the coordinate position data of the remaining (n−1) sample areas, then coordinate transformation parameters will be obtained accurately because a large number of accurate data are included in the remaining coordinate position data. Therefore, if the nonlinear error components of the coordinate position data of the n sample areas, including the first sample area, are calculated using the coordinate transformation parameters, the dispersion B(1, n−1) of the nonlinear error components to be obtained will become large because the first nonlinear error component is large. In addition, a value T1(1), which is obtained by standardizing the dispersion B(1, n−1) with an average value of the dispersions B(1, n−2), B(1, n−3), . . . , and B(1, $N_{min}$) of the nonlinear error components calculated by removing larger nonlinear error components in sequence from the remaining coordinate position data, has been calculated. Therefore, the reliability of the value T(1), which is data to be compared, is high.

Next, the coordinate position data of the second (m=2) sample area is removed and statistical processing is performed using the coordinate position data of the remaining (n−1) sample regions. In this case, the first coordinate position data, which is a jump shot, is included in the first calculation. Therefore, a value T1(2), which is obtained by standardizing the dispersion B(2, n−1) with an average value of the dispersions B(2, n−1), B(2, n-2), . . . , and B(2, $N_{min}$) of the nonlinear error components to be obtained, becomes small. Likewise, values T1(3), . . . , and T1(N), which are obtained by removing the third sample area and the subsequent sample areas, also become small. Therefore, the first sample area, which has been removed when the largest value T1(1) among the N average values T1(3), . . . , and T1(N) is obtained, is finally specified as a sample area in which the nonlinear error component is large (jump shot), and accurate alignment is performed by removing, for example, that jump shot.

Next, when two jump shots exist on the substrate, the first and second sample areas, for example, are assumed to be jump shots. In such a case, the dispersions B(1, N−1) and B(1, N−2) of the nonlinear error components become a relatively large value, and a value T2(1,2) (m1=1, m2=2), which is obtained by standardizing the sum of the dispersions B(1, N−1) and B(1, N−2) with the average value of the dispersions B(1, N−2), . . . , and B(1, $N_m$in) of the nonlinear error components, becomes a large value. Also, for integers m1 and m2, the values T2(m1, m2) of other combinations become smaller than the value T2(1, 2) because the coordinate transformation parameters, including the jump shot data, have been calculated. Therefore, two sample areas, which have been removed when the largest value T2(m1, m2) is obtained, are specified as sample areas where the nonlinear error component is large (jump shots), and accurate alignment is performed by removing, for example, those jump shots. When the value T2(m1, m2) becomes largest, the value T2(m2, m1) where integers m1 and m2 are reversed should be the second largest. Therefore, if this is not effected, for example it may be judged that two jump shots do not exist.

Actually in these cases, it has not been determined whether the number of jump shots is 0, 1, or 2, but the jump shots and the number thereof can be specified by mutually comparing N values T1(m) and N values T2(m1, m2). Therefore, an evaluation reference for specifying a jump shot is to be determined automatically.

Also, even if a sample area where the nonlinear error component thereof is large exists, if the sample area is removed as a jump shot when the nonlinear error component is small, conversely there will be the possibility that alignment accuracy will be reduced. Then, in a case where the largest nonlinear error component is less than a predetermined threshold value, each coordinate position data is weighted according to the inverse number of the average value T1(m) or T2(m1, m2) of the nonlinear error components, and array coordinates are calculated by statistical processing (for example, weighting EGA calculation).

Next, in the above-described fifth alignment method of the present invention, coordinate conversion parameters are calculated while removing the m-th (m=1, 2, . . . , and N) sample area in sequence from N sample areas and then the dispersion B'(m, N−1) of the nonlinear error components, including the m-th sample region, is obtained. For example, if the first sample area is assumed to be a jump shot, the value of the dispersion B'(1, N−1) will become large, so a jump shot can be specified accurately without any influence from the value of the jump shot itself. Thereafter, for example, the measured data of the jump shot is slightly weighted, and the array coordinates of each area to be processed are calculated with all the measured data by statistical processing, thereby reducing the influence of the jump shot.

Next, in the above-described sixth alignment method of the present invention, first a sample area in which the nonlinear error component thereof is large is specified as a jump region (jump shot). Thereafter, for example, the measured data of the jump shot is slightly weighted, and the array coordinates of each area to be processed area are calculated using all the measured data by statistical processing, thereby reducing the influence of the jump shot.

A seventh alignment method according to the present invention is premised on the assumption that, based on array coordinates on a first coordinate system set on a substrate, a plurality of areas to be processed areas arrayed on said substrate are respectively aligned with predetermined processing positions within a second coordinate system prescribing a moving position of said substrate.

The seventh alignment method, based on the above-described assumption, comprises the steps of (1) measuring coordinate positions on said second coordinate system of N sample areas (where N is an integer of 6 or more) selected in advance from among said plurality of areas to be processed; (2) statistically processing (N−1) coordinate position data in which the m-th sample area (where an initial value of m is 1) is excluded from the coordinate position data of said N sample areas measured in the step (1), and obtaining nonlinear error components of respective coordinate position data and dispersions (worst value or three times the standard deviation and the like) D(m, N−1) of the (N−1) nonlinear error components; (3) excluding a sample area in which the nonlinear error component is largest among the nonlinear error components obtained in the step (2) and obtaining (N−2) sample areas; (4) for the (N−2) sample areas obtained in the step (3), repeating said steps (2) and until the number of the remaining sample areas reaches a predetermined lower limit value $N_{min}$ in order to obtain the respective dispersions D(m, n) (where n is an integer between (N−2) and $N_{min}$) of the nonlinear error components, and obtaining an average value T(m) of the dispersions D(m, n); (5) respectively repeating the steps (2) to (4) while a value of m is being increased up to N one-by-one to obtain the dispersions D(m, n) of the nonlinear error components and the average value T(m) of the dispersions D(m, n); and (6) among the N average values T(m) obtained in steps (4) and (5), setting a value of m giving the smallest average value to M and obtaining n sample areas that are left when said dispersions D(M, n) of the nonlinear error components become a predetermined upper limit value $D_{max}$ or less. The coordinate position data measured in step (1) of the n sample areas left in the step (6) are statistically processed and the coordinate positions on said second coordinate system of each of said plurality of areas on said substrate are calculated.

The above-described seventh alignment method has been made based on the assumption that the occurrence probability of jump shots, for example, in a conventional semiconductor device fabrication process is usually at most two or less per wafer. N sample areas (sample shots $SA_1$ to $SA_N$) are selected from a plurality of areas to be processed on a substrate, and first, in the second step the coordinate position data of the first sample area are removed and the nonlinear error components of the remaining (N−1) coordinate position data and the dispersion D(1, N−1) of the components are obtained.

Thereafter, when the second, third, ... sample areas are removed in sequence until the number of the remaining sample areas reaches $N_{min}$, a sample area in which the nonlinear error component thereof has been the worst value among the remaining sample areas is removed, and the dispersions D(1, n) (n=N−2, N−1, ..., and 1) of the nonlinear error components are obtained. Also, an average value T(1) of these (N−2) dispersions is obtained. The value of the $N_{min}$ is a value which is determined according to the number of the parameters of a conversion function converting the first coordinate system to the second coordinate system. When 6 parameters are used as in Equation (1), the value of $N_{min}$ is 4 because the nonlinear error component becomes 0 when the number of sample areas is 3 (6 for coordinate data).

Next, again the coordinate position data of N sample areas are collected and in the second step, the coordinate position data of the second sample area is removed this time, with the nonlinear error components of the remaining (N−1) coordinate position data and the dispersion D(2, N−1) of the components thereby being obtained. Thereafter, in a manner where a sample area in which the nonlinear error component thereof has been a worst value is selected, the second, third, ... sample areas are removed in sequence until the number of the remaining sample areas reaches $N_{min}$, and the dispersions D(2, n) of the nonlinear error components are obtained. Also, an average value T(2) of these (N−2) dispersions is obtained. Likewise, if the third sample area to the Nth sample area are removed and the same operation is repeated to obtain nonlinear error components, the dispersions D(m, n) of the nonlinear error components, and the average value T(m) of the dispersions, then N combinations will be obtained.

In the above-described seventh alignment method of the present invention, a variable (m) as the average value/T(m) (m=1 to N) becomes smallest is considered to be M, and a combination of sample areas (M group), which was gradually removed when the M-th sample area is first removed form N sample areas, is an object to be removed as a jump shot. In such a case, the average value T(m) is an average value of the dispersions of (N−2) nonlinear error components after two sample areas are removed from N sample areas. Therefore, when two jump shots exist, the average value T(m) becomes minimum when these two jump shots are removed. Therefore, particularly when the maximum number of jump shots is two, the jump shots can be accurately removed according to the seventh alignment method of the present invention. Also, when the dispersion D(M, n) becomes less than a predetermined upper limit value $D_{max}$ among the M group, a jump shot can be considered to have been removed because the value of the nonlinear error components of the remaining sample areas is small.

BRIEF DESCRIPTION OF THE DRAWINGS

The above and other objects and advantages will become apparent from the following detailed description when read in conjunction with the accompanying drawings wherein:

FIG. 1(b) is a table showing the alignment errors in the array of FIG. 1(a);

FIG. 1(c) is a table showing the linear errors in the array of FIG. 1(a);

FIG. 1(d) is a table showing the nonlinear errors in the array of FIG. 1(a);

FIG. 3(b) is a table showing the alignment errors in the array of FIG. 3(a);

FIG. 3(c) is a table showing the linear errors in the array of FIG. 3(a);

FIG. 3(d) is a table showing the nonlinear errors in the array of FIG. 3(a);

FIG. 10(b) is a table showing the alignment errors in the shot array of FIG. 10(a);

FIG. 10(c) is a table showing the linear errors in the shot array of FIG. 10(a);

FIG. 10(d) is a table showing the nonlinear errors in the shot array of FIG. 10(a);

FIG. 12(c) is a table showing the linear errors in the shot array of FIG. 12(a);

FIG. 12(d) is a table showing the nonlinear errors in the shot array of FIG. 12(a);

DESCRIPTION OF THE PREFERRED EMBODIMENTS

A preferred embodiment of an alignment method of the present invention will hereinafter be described in reference to the accompanying drawings.

Figure 8:
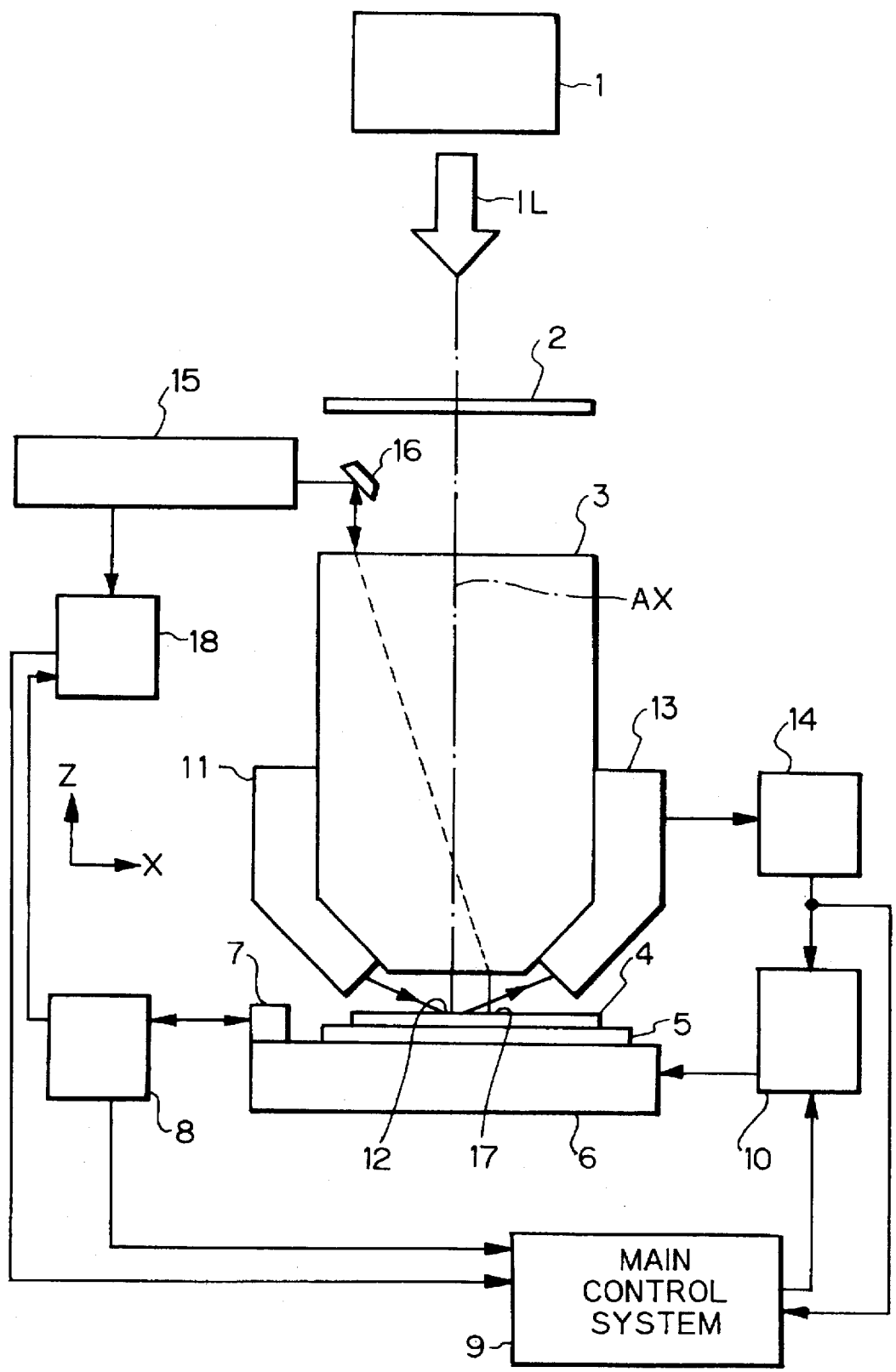
FIG. 8 is a schematic view showing a projection exposure system where a first embodiment of an alignment method of the present invention is executed.

FIG. 8 shows a projection exposure apparatus where an alignment method of a first embodiment of the present invention is used. In the figure, the illumination light IL for exposure from an illumination optical system 1 illuminates patterns on a reticle 2 at a uniform illumination distribution. The patterns, reduced in size through a projection optical system 3, are transferred onto shot areas on a wafer 4 upon which photoresist is coated. Each shot area is exposed in accordance with the patterns which is reduced in size. In this exposure apparatus, the Z axis is taken parallel to the optical axis AX of the projection optical system 3, the X axis is taken on a plane perpendicular to the Z axis parallel to the surface of FIG. 8, and the Y axis is taken perpendicular to the surface of FIG. 8.

The wafer 4 is held on a wafer stage 6 through a wafer holder 5. The wafer stage 6 is formed by an X-Y stage positioning the wafer 4 in the X direction and the Y direction, a Z stage moving the wafer in the Z direction, a θ stage rotating the wafer 4 on an axis parallel to the optical axis AX, and a leveling stage correcting the angle of inclination of the wafer 4. A laser beam from an external two-axis laser interferometer 8 is reflected by a two-axis movable mirror 7 (FIG. 8 shows one for only the X axis) fixedly mounted on the upper surface of the stage 6, and the X coordinate and the Y coordinate of the wafer stage 6 are measured at all times by the laser interferometer 8. A coordinate system, which is determined based on the coordinates (X, Y) thus measured by the laser interferometer 8, is called the stage coordinate system or stationary coordinate system. The measured coordinates (X, Y) are supplied to a main control system 9 for controlling the operation of the entire exposure apparatus. Based on the measured coordinates, the main control system 9 controls the positioning operation of the wafer stage 6 through a wafer stage drive system 10.

An oblique incidence type focus position detecting system comprising a light emitting system 11 and a light receiving system 13 is arranged on the side surface portion of the projection optical system 3. From the light emitting system 11, slit images 12 (or a dot pattern image) are projected obliquely with respect to the optical axis AX of the projection optical system 3 and, for example, on a plurality of measuring points (three or more points) on the wafer 4 in the vicinity of the optical axis AX. The reflected light from a plurality of slit images 12 again forms the slit images, for example, on the photoelectric microscope of the light receiving system 13. In this case, a plurality of focus signals corresponding to the Z coordinates (focus position) of a plurality of measuring points on the wafer 4 are generated in the light receiving system 13 by making use of the fact that if the surface position of the wafer 4 is shifted in the Z direction, a slit image to be formed again will be shifted laterally. These focus signals are supplied to a focus signal processing system 14.

The focus signal processing system 14 calculates the Z coordinates and the angle of inclination of a plane approximate to a surface including a plurality of measuring points on the wafer 4, and supplies them to the wafer stage drive system 10 and also supplies the Z coordinates of each measuring point to the main control system 9. During actual exposure, the wafer stage drive system 10 controls the wafer stage 6 so that the supplied Z coordinates and angle of inclination match with the image forming surface of the projection optical system 3. On the other hand, when alignment is performed and the surface roughness distribution of the wafer 4 is measured, to be described later, the main control system 6 processes the focus signal from the focus signal processing system 14 while moving the wafer 4 on the X-Y plane through the wafer stage 6 and checks the roughness of each sample shot on the wafer 4.

In general, the process wherein patterns on a reticle are transferred onto shot regions or areas on a wafer by exposure and then said transferred patterns are developed is repeated 10 to 20 times in order to fabricate a semiconductor device. Therefore, it is necessary that patterns on a reticle to be exposed are accurately aligned (or overlaid) with respect to previously defined circuit patterns on the shot areas on the wafer 4. For this, the projection exposure apparatus of FIG. 8 is provided with an alignment optical system 15 of through-the-lens (TTL) type and laser-step-alignment (LSA) type for detecting coordinates of a wafer mark formed on each shot area on the wafer 4. Note that as the alignment optical system 15, an image pick-up type or a two luminous flux inference type may be used, but in this embodiment the LSA type has been used as an example.

Figure 9A:
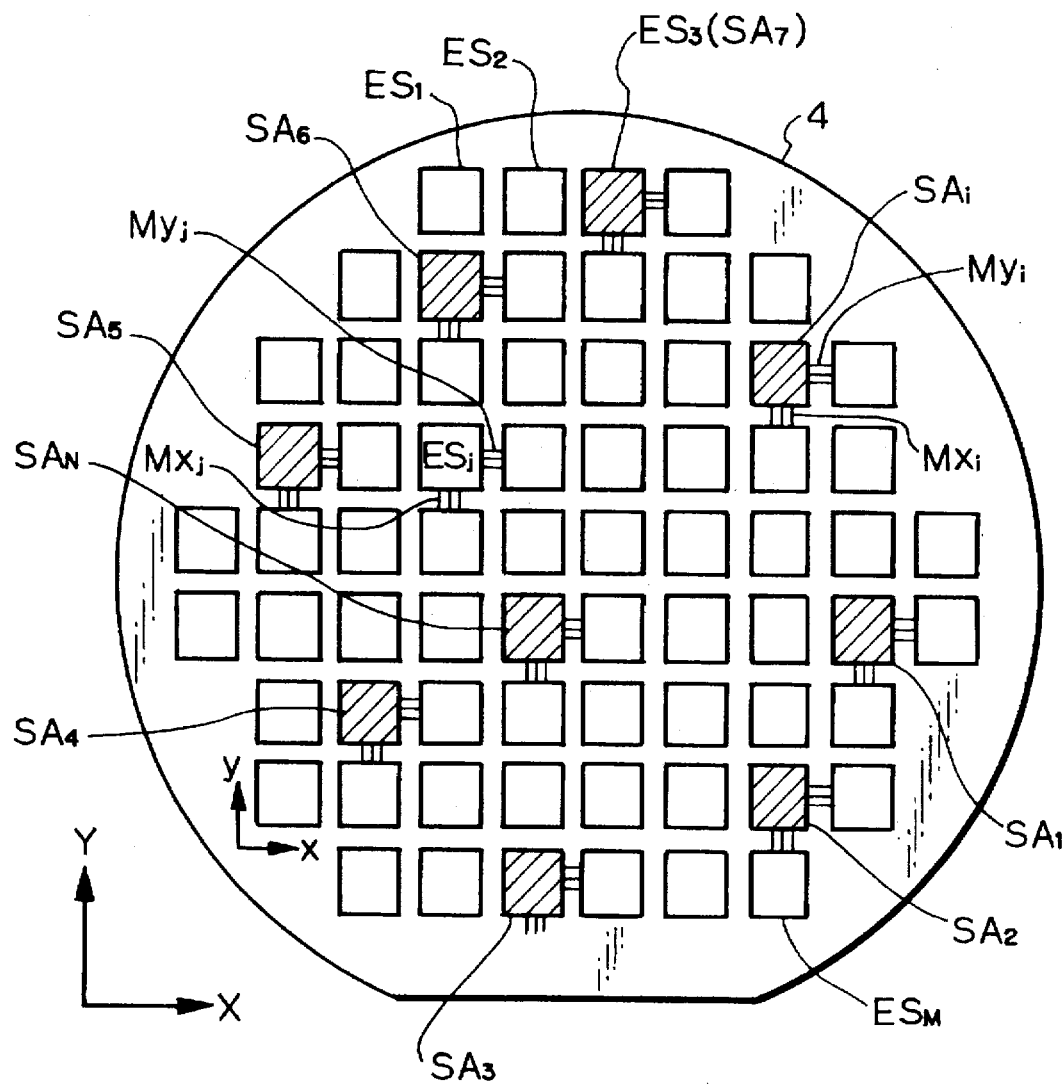
FIG. 9(a) is a plan view showing an example of a sample shot array on a wafer to be exposed of the first embodiment of the present invention.
Figure 9B:
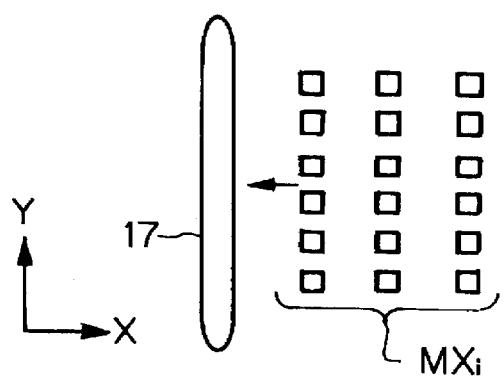
FIG. 9(b) is a diagram used to explain how wafer marks are detected.

In such a case, a laser beam for detection, emitted from the alignment optical system 15, is incident on the projection optical system 3 via a mirror 16 for bending an optical path, and the laser beam passing through the projection optical system 3 is condensed on the wafer 4 as a light spot 17 in the form of a slit elongated in the Y direction, as shown in FIG. 9(b). The wafer stage 6 of FIG. 8 is then driven and the X-axis wafer mark $M_{xi}$ of an object of detection on the wafer 4 is so moved as to cross the light spot 17 in the X direction. The wafer marks $M_{xi}$ are marks in which a plurality of rows of patterns comprising dot rows arranged at predetermined pitches are arranged in the X direction. Since diffracted light is emitted in a predetermined direction when the wafer mark $M_{xi}$ crosses the light spot 17, the X coordinate of the wafer mark $M_{xi}$ is detected.

Returning to FIG. 8, the diffracted light of the light spot 17 on the wafer 4 by the wafer mark returns to the alignment optical system 15 via the projection optical system 3 and the mirror 16. Then, the alignment optical system 15 supplies an alignment signal obtained by the photoelectric conversion of the diffracted light to the alignment signal processing system 18. At this time, the coordinates (X, Y) measured by the laser interferometer 8 has also been supplied to the alignment signal processing system 18. The alignment signal processing system 18 detects the X coordinate as the light spot 17 is at the center position of the X-axis wafer mark, and supplies the detected X coordinate to the main control system 9. Also, an alignment optical system (not shown) for Y axis is provided, and the Y coordinate corresponding to the wafer mark for Y axis is detected by the alignment optical system and the alignment signal processing system 18. The detected Y coordinate is also supplied to the main control system 9.

Basic operation is performed as follows. First the wafer 4 is placed on the wafer holder 5 and then the main control system 9 moves the wafer 4 on the X-Y plane by means of the wafer stage drive system 10 and the wafer stage 6. The wafer mark of the sample shot on the wafer 4 is thereby set in the vicinity of the position where a light spot is illuminated from the alignment optical system 15 (or the alignment optical system for Y axis). The rough alignment of the wafer 4 in this case is performed, for example, based on the coordinates of each shot region prescribed on the coordinate system on the wafer 4. Thereafter, the coordinates of the water mark are measured with a high degree of accuracy by the alignment signal processing system 18 by moving the wafer 4 in the X direction or Y direction. With the coordinates of the wafer mark of each sample shot measured in this way, the main control system 9 calculates array coordinates on the stage coordinate system (X, Y) of all shot areas on the wafer 4, as will be described later. Based on the result of this calculation, the pattern images on the reticle 2 are transferred on the shot regions by step-and-repeat process (or step-and-scan process).

A detailed description will hereinafter be made of various examples of the alignment method of the first embodiment of the present invention.

(A) Basic Alignment Method

FIG. 9(a) shows an example of the shot array of the wafer 4 of this embodiment. In the figure, M (in FIG. 9(a) M=68) shot regions or areas $ES_1$ to $ES_M$ are arrayed on the wafer 4, and circuit patterns are formed in shot areas $ES_j$ (j=1 to M), respectively. Each shot area has a wafer mark $Mx_j$ for X axis and a wafer mark $My_j$ for Y axis. In this case, on a sample coordinate system (x, y) set on the wafer 4, the x coordinate $x_j$ of the center of the X-axis wafer mark $Mx_j$ and the y coordinate $y_j$ of the center of the Y-axis wafer mark $My_j$ have been stored as design coordinates in the storage device of the main control system 9 of FIG. 8. In the following, the x coordinate of the center of the wafer mark $Mx_j$ and the y coordinate of the center of the wafer mark $My_j$ are assumed respectively to be the x coordinate and the y coordinate on the sample coordinate system of the center of the shot area $ES_j$, and the coordinates of the wafer mark are assumed to be the coordinates of the shot area. Note that although in reality an offset usually exists between the center coordinates of the wafer mark and the center coordinates of the corresponding shot area, the offset will be ignored for simplicity.

At this time, the conversion relationship from the sample coordinate system (x, y) to the stage coordinate system (X, Y) is defined with six parameters (scaling Rx in X direction, scaling Ry in Y direction, rotation θ, orthogonal degree error w, offset Ox in X direction, and offset Oy in Y direction) by the conversion equation (1). And, in order to determine the values of the six parameters, for N shot areas (where 4≦N≦M) selected from among M shot areas, i.e., N sample shots $SA_1$ to $SA_N$, the X coordinate $XM_i$ (where i=1 to N) of the X-axis wafer mark and the Y coordinate $YM_i$ (where i=1 to N) of the Y-axis wafer mark are measured using the alignment optical system 15 of FIG. 8. A vector (Δxi, Δyi), which is obtained by subtracting the design array coordinates of the wafer mark of the sample shot (xi, yi) from the coordinates (XMi, YMi) thus measured, is a vector of an alignment error.

Next, by substituting the design array coordinates (xi, yi) of each sample shot $SA_i$ into Equation (1), the calculated array coordinates (Xi, Yi) on the stage coordinate system (X, Y) of each sample shot are expressed as a function of six parameters and design array coordinates. Then, the values of the six parameters are determined by EGA calculation so that the sum of the squared alignment errors of N sample shots expressed in Equation (2), i.e., the residual error components become minimum.

Thereafter, the final calculated array coordinates (Xi, Yi) of each sample shot $SA_i$ is obtained by substituting the determined six parameters (Rx, Ry, θ, w, Ox, Oy) and the design array coordinates (xi, yi) of each sample shot $SA_i$ into Equation (1). At this time, a vector, which is obtained by subtracting the design array coordinates (xi, yi) from the calculated array coordinates (Xi, Yi), is a vector of a linear error component. Also, a vector, which is obtained by subtracting the calculated array coordinates (Xi, Yi) from the measured coordinates (XMi, YMi), is a vector of a nonlinear error component. In this embodiment, a sample shot in which the absolute value of the vector of the nonlinear error component thereof is large is excluded as a jump shot and, based on the array coordinates measured for the remaining sample shot, six parameters are determined by EGA calculation. Finally, the array coordinates of all shot areas on the wafer are calculated using Equation (1) and, according to the array coordinates, the shot areas on the wafer are sequentially aligned at exposure positions and exposure is performed. In the following, a description will be made of one example of a method for excluding the jump shot.

(B) First Method of Removing a Jump Shot

In this method, for the leading wafer among wafers of a certain lot, all shot areas are measured as sample shots and a jump shot is specified from the sample shots. This method is likewise applicable even in a case where the number of sample shots is smaller than that of all shot areas.

Figure 10A:
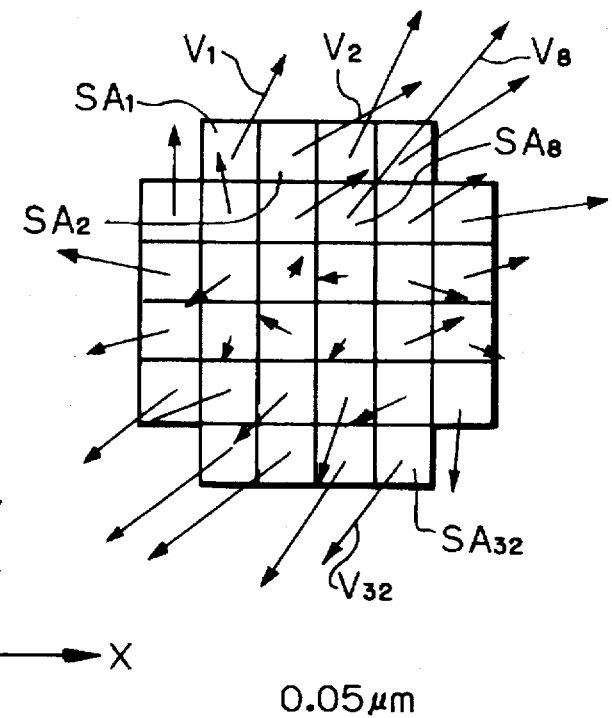
FIG. 10(a) is a diagram showing an example of the array of sample shots including a jump shot, which is a first embodiment of the present invention.

FIG. 10(a) shows a case where all of thirty-two shot areas on a wafer are considered to be sample shots $SA_1$ to $SA_{32}$. In the figure, the alignment errors (remainder obtained by subtracting design coordinates from measured coordinates) of the sample shots $SA_1$ to $SA_{32}$ are expressed by vectors $V_1$ to $V_{32}$. Also, FIG. 10(b) shows the number of measured sample shots, the average value of the X components of the alignment errors, the average value of the Y components of the alignment errors, three times the standard deviation of the X components (3σ), three times the standard deviation of the Y components (3σ), the errors from one of the scalings Rx and Ry, orthogonal degree errors w, and values of rotation θ. In addition, FIG. 10(c) shows the value (3σ) of three times the standard deviation of the linear error components in each of the X and Y directions which are obtained for each sample shot with the parameters Rx, Ry, w, θ, Ox, and Oy. Furthermore, FIG. 10(d) shows the value (3σ) of three times the standard deviation of the nonlinear error components in each of the X and Y directions which are obtained for each sample shot.

Figure 11A:
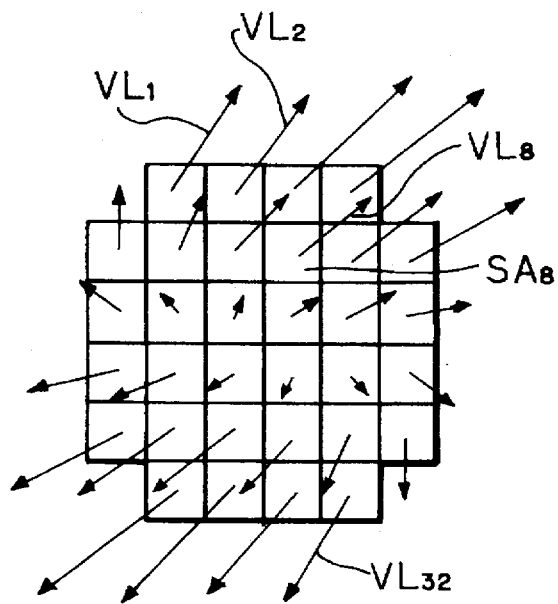
FIG. 11(a) is a diagram showing the vectors of the linear error components in the shot array of FIG. 10(a)
Figure 11B:
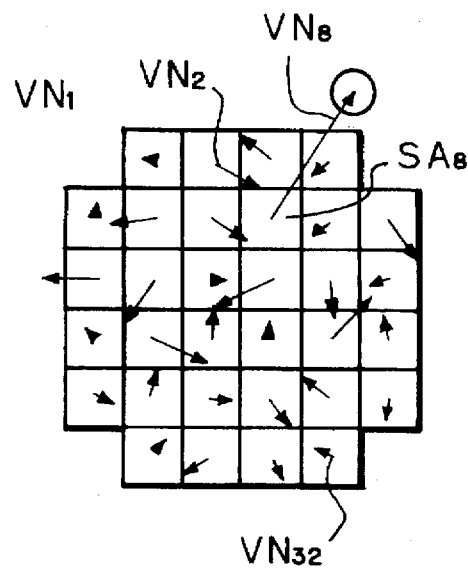
FIG. 11(b) is a diagram showing the vectors of the nonlinear error components in the shot array of FIG. 10(a)

FIG. 11(a) shows the vectors $VL_1$ to $VL_{32}$ of the linear error components of the alignment errors in FIG. 10(a). FIG. 11(b) shows the vectors $VN_1$ to $VN_{32}$ of the nonlinear error components which are obtained by subtracting the linear error component of FIG. 11(a) from the alignment error of FIG. 10(a).

In this case, since the absolute value of the nonlinear error vector $VN_8$ of the sample shot $SA_8$ is particularly large, as shown in FIG. 11(b), the sample shot $SA_8$ is considered to be a jump shot. Also, the possibility that the vectors of the linear error components shown in FIG. 11(a) have been influenced by this jump shot $SA_8$ is high because, in the stage of the alignment error of FIG. 10(a), the absolute value of the vector $V_8$ representative of an error in the sample shot $SA_8$ is a maximum.

Figure 13A:
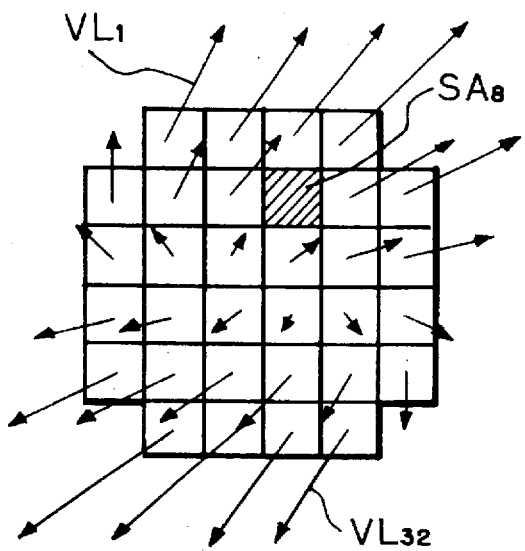
FIG. 13(a) is a diagram showing the vectors of the linear error components in the shot array of FIG. 12(a)
Figure 13B:
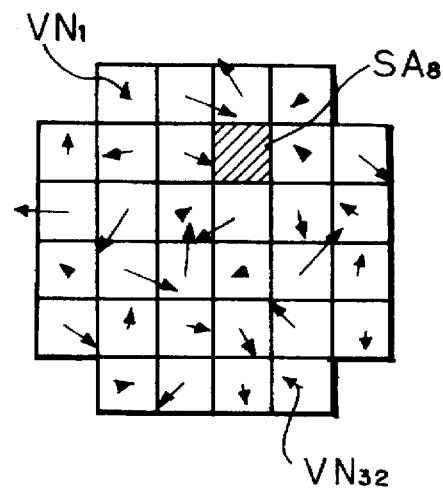
FIG. 13(b) is a diagram showing the vectors of the nonlinear error components in the shot array of FIG. 12(a)
Figures 12A, 12B:
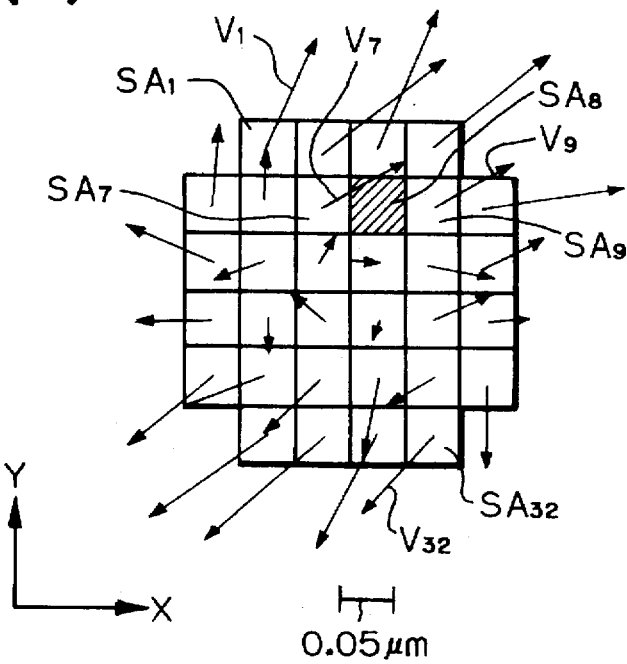
FIG. 12(a) is a table showing the alignment errors in the shot array where the jump shot of FIG. 10(a) has been excluded.
FIG. 12(b) is a table showing the alignment errors in the shot array of FIG. 12(a)

Then, linear error components and nonlinear error components are obtained using the remaining thirty-one sample shots, excluding the jump shot $SA_8$ from FIG. 10(a). The result is shown in FIGS. 12(a) to 12(d) and FIGS. 13(a) to 13(d). FIG. 12(a) shows the vectors $V_1$ to $V_7$, $V_9$ to $V_{32}$ of the alignment errors of thirty-one sample shots $SA_1$ to $SA_7$, $SA_9$ to $SA_{32}$, excluding the sample shot $SA_8$. FIGS. 12(b) to 12(d) show values similar to those of FIGS. 10(b) to 10(d) for thirty-one sample shots. Also, FIG. 13(a) shows the vectors $VL_1$ to $VL_{32}$ of the linear error components of the alignment errors of FIG. 12(a). FIG. 13(b) shows the vectors $VN_1$ to $VN_{32}$ of the nonlinear error components which are obtained by subtracting the linear error component of FIG. 13(a) from the alignment error of FIG. 12(a).

Figure 14:
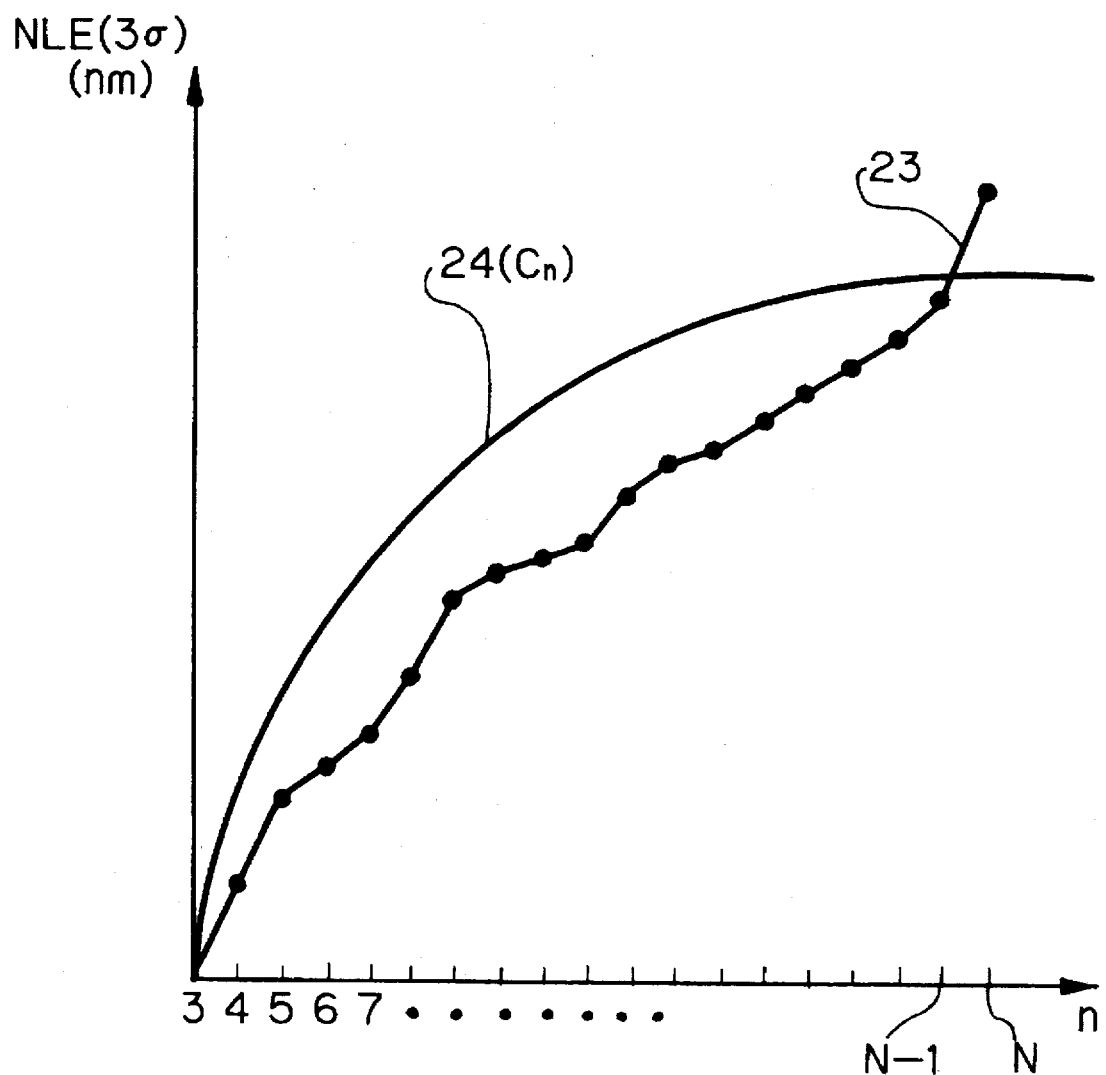
FIG. 14 is a graph showing the relationship of three times a standard deviation of a nonlinear error component (NLE (3σ)) to the number of sample shots (n)

By comparing FIGS. 10(b) to 10(d) with FIGS. 12(b) to 12(d), it is understood that the nonlinear error component of the case of FIG. 12(a) is smaller than the nonlinear error component of the case of FIG. 10(a). Subsequently, the operation that a sample shot where the nonlinear error component thereof is largest is excluded from the remaining sample shots is repeated. If three times the standard deviation of the absolute value of the vectors of the nonlinear error components is set to NLE(3σ), NLE(3σ) will be expressed by a polygonal line 23 of FIG. 14 as a function of the number n of the remaining sample shots. The axis of abscissas of FIG. 14 represents the number n of the remaining sample shots, in a case where the first number of sample shots is N, and the axis of ordinates represents NLE(3σ). As shown in FIG. 14, NLE(3σ) becomes monotonically small as the number n of the remaining sample shots, becomes small, and NLE(3σ) becomes zero at the time that the number of the remaining sample shots has been three.

Thus, the value of the nonlinear error components becoming small means that the probability that a random nonlinear error component is considered a linear error component becomes large. In other words, when the number n of the remaining sample shots is small, the probability that a random nonlinear error component is mixed with a linear error component is high and the reliability of the linear error component becomes low. If, on the other hand, the number n of the remaining sample shots is increased, the reliability of the linear error component will be increased by the effect of averaging.

Figure 15:
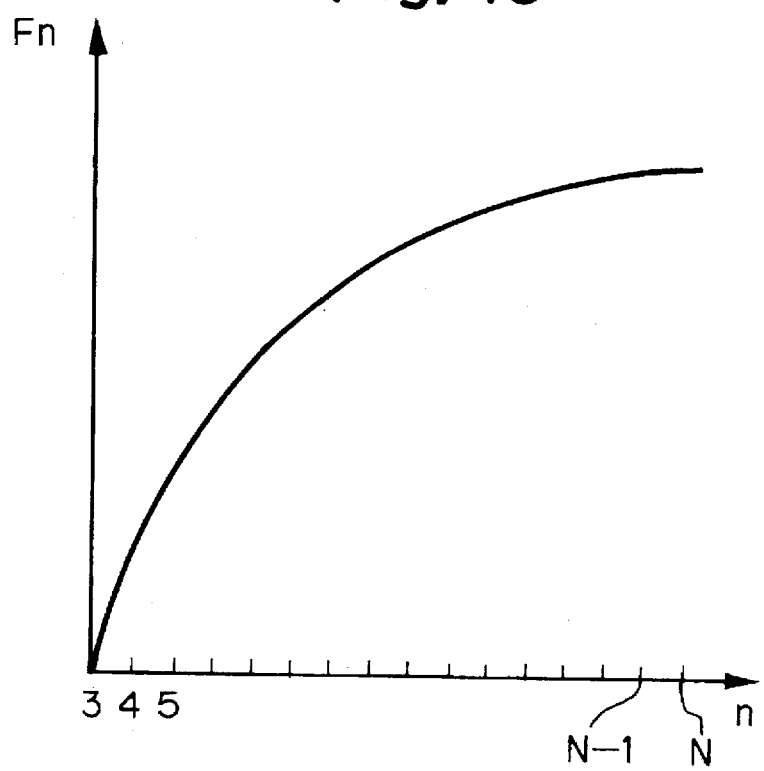
FIG. 15 is a graph showing the relationship of a function $F_n$ of reliability of a linear error component to the number of sample shots (n)

FIG. 15 shows a function $F_n$ corresponding to the reliability of the linear error component. If the number of the remaining sample shots is represented by n, the design coordinates of the wafer marks of the sample shots are represented by $(x_1, y_1), (x_2, y_2), \ldots,$ and $(x_n, y_n)$, and the measurement accuracy of the wafer mark by the alignment system is represented by $\sigma_a$, this function $F_n$ will be a function of these values $(x_1, y_1, x_2, y_2, \ldots, x_n, y_n, \sigma_a)$.

In order to obtain the function $F_n$, random errors are given to the measured values (alignment errors) of the array coordinates of each sample shot, under the state that each of the linear error components of the array coordinates of n sample shots is zero, and based on this data, six parameters are obtained by a least-squares approximation. Then, three times the standard deviations of the linear error components of the array coordinates of n sample shots, 3σ, are obtained using these parameters, and these are plotted with respect to the n sample shots. Also, if a predetermined function $F_o$ is used, with respect to a normal Gaussian distribution random error the function $F_n$ will be given by the following equation.

$$F_n = F_o \cdot (n-3)^{1/2} \quad (3)$$

Also, if, besides the function $F_n$, such random errors are given to obtain the nonlinear error components of the array coordinates of sample shots, the effect of averaging will become high according to the number n of sample shots. According to this, the accuracy of the linear error components will also become high.

Figure 16:
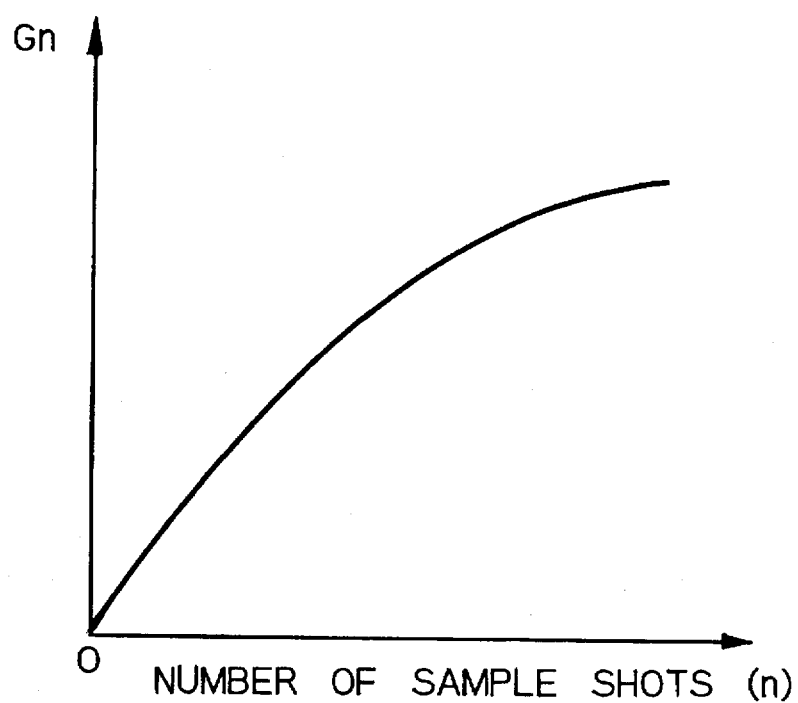
FIG. 16 is a graph showing the relationship of a function $G_n$ of an effect of averaging to the number of sample shots (n)

FIG. 16 shows the accuracy of the linear error components expressed by a function $G_n$ of the number n of sample shots. The function $G_n$ is a function which monotonically increases as the number n of sample shots becomes large. With respect to a normal Gaussian distribution random error, the function $G_n$ will be given by the following equation.

$$Gn = n^{1/2} \quad (4)$$

Since, in the above, the function $F_n$ of FIG. 15 represents the degree of the reliability of the nonlinear error component and the function $G_n$ of FIG. 16 represents the effect of averaging with respect to the nonlinear error component, an evaluation value $A_n$ is obtained by dividing three times a standard deviation of a nonlinear error component, i.e., NLE(3σ) by the product of the functions $F_n$ and $G_n$. That is, the following equation will be obtained.

$$A_n = NLE(3\sigma)/(F_n \cdot G_n) \quad (5)$$

Figure 17:
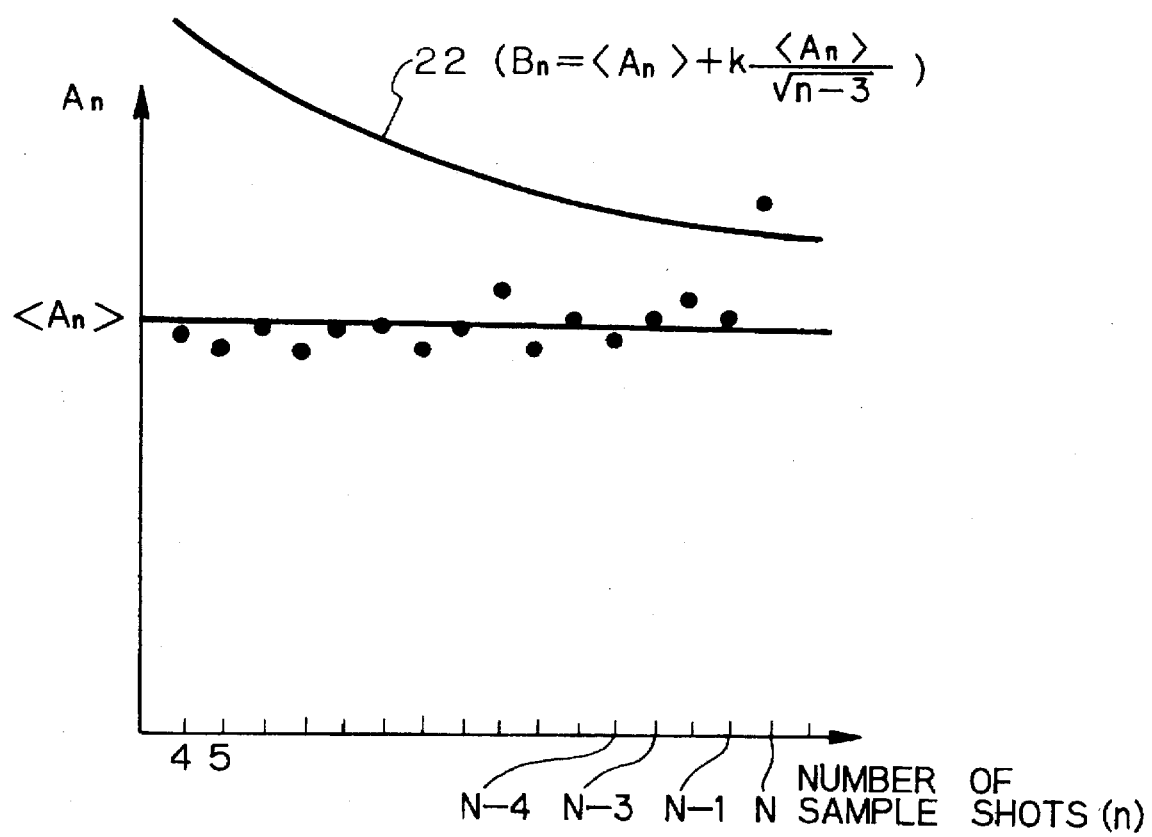
FIG. 17 is a graph showing the relationship of an evaluation value $A_n$ to the number of sample shots (n), the evaluation value being obtained by dividing the three times a standard deviation of a nonlinear error component (NLE (3σ)) of FIG. 14 by a function of $F_n \cdot G_n$.

This evaluation value $A_n$ becomes almost a constant value with respect to the number n of sample shots, as shown in FIG. 17, but it becomes a large value when a jump shot is included in the sample shots. Then, until the number n of sample shots, becomes a minimum value, i.e., 4 from a maximum value N, respective evaluation values $A_n$ are obtained and then an average value $<A_n>$ of the evaluation values $A_n$ is calculated. As a result of this, a jump shot in which the nonlinear error component thereof is large is considered to be included in n sample shots in which an evaluation value $A_n$ is larger than an average value $<A_n>$. Then, as an example, a sample shot other than sample shots remaining when an evaluation value $A_n$ is first less than an average value $<A_n>$ is rejected as a jump shot.

In the example of FIG. 17, an evaluation value $A_n$ becomes less than an average value $<A_n>$ at the time when the number of sample shots has reached (N−4) from (N−3).

Therefore, where the number of sample shots has reached (N−4), i.e., where four jump shots have been removed, the removal of jump shots is stopped.

However, in a case where a nonlinear error component is very large, if the number of sample shots is reduced until an evaluation value $A_n$ is less than an average value $<A_n>$, conversely there will be the possibility that alignment accuracy will be deteriorated. Then, three times the standard deviation of the average value $<A_n>$ of n sample shots, i.e., $A(3\sigma)$, is obtained, and if an evaluation value is less than a threshold value $B_n$ comprising ($<A_n>+A(3\sigma)$), then a jump shot may be removed in a range where the evaluation value $A_n$ exceeds the threshold value $B_n$, without removing a sample shot. If a Gaussian distribution is assumed, the threshold value $B_n$ will be expressed using a predetermined coefficient k by the following equation. Note that the coefficient k is usually 1 and is increased or decreased from 1 as needed.

$$B_n = <A_n> + A(3\sigma) \quad (6)$$
$$= <A_n> + k \cdot <A_n>/(n-3)^{1/2}$$

This threshold value $B_n$ of Equation (6) becomes a function which decreases monotonically with respect to the number n of sample shots, as shown by a curve 22 in FIG. 17. Also, since in the example of FIG. 17 the value of an evaluation value $A_n$ is less than the threshold value $B_n$ when the number of sample shots reaches (N−1), only one sample shot is removed as a jump shot. In the way described above, a jump shot is removed.

While in the above-described embodiment, three times a standard deviation of a nonlinear error component, NLE (3σ), has been used as the dispersion of the nonlinear error component, similar results would be obtained even if the worst value of the nonlinear error component among the remaining sample shots were used instead of NLE(3σ).

Also, in the above embodiment all shot areas on a wafer have been considered sample shots. Therefore, even if jump shots were removed, in many cases the number of sample shots would still be too large. Then, for example, only a necessary number of sample shots near the outer circumference of a wafer is selected from the remaining sample shots. For the remaining wafers of that lot, only sample shots finally selected at the leading wafer are measured on the stage coordinate system, and based on the result of the measurement, alignment is performed by an EGA method. With this, when the positions where jump shots occur are the same with respect to wafers in the same lot, alignment can be performed with a high degree of accuracy without the influence of the jump shots.

In addition, the number of sample shots, which finally remain, may automatically be changed, for example, according to the value of the average value $<A_n>$ of the evaluation values $A_n$ shown in FIG. 17. For example, when an average value $<A_n>$ is large, a large number of sample shots is used. For devices (wafers) where shot array accuracy is bad, alignment can be performed using a large number of sample shots by an EGA method, and for devices (wafers) where shot array accuracy is good, alignment can be performed using a small number of sample shots by an EGA method.

Furthermore, while in the above embodiment the evaluation value $A_n$ has been obtained by dividing three times the standard deviation of the nonlinear error component shown in FIG. 14, i.e., NLE(3σ) by the product of functions $F_n$ and $G_n$, the NLE(3σ) itself may be used. In such a case, a function $C_n$ is expressed by the product of $F_n \cdot G_n$ and a predetermined coefficient $C_o$, and this function $C_n$ and NLE(3σ) are compared. If the function $C_n$ is expressed by Gaussian distribution, from Equations (3) and (4) the function $C_n$ will become as follows.

$$C_n = C_0 \cdot F_0 \cdot (n-3)^{1/2} \cdot n^{1/2} \quad (7)$$
$$= K_1 \cdot \{n(n-3)\}^{1/2}$$

where the coefficient $K_1$ is $C_o \cdot F_o$. The function $C_n$ of Equation (7) becomes a function such as that shown by a curve 24 in FIG. 14. Also, the coefficient $K_1$ is determined by averaging results, which, in a range the value of n changes from N to 4, are obtained by dividing NLE(3σ) by $\{n(n-3)\}^{1/2}$. And, a jump shot is removed until, in FIG. 14, the NLE(3σ) of the line 23 becomes less than the function $C_n$ of the curve 23.

Also, while in the above embodiment all sample areas have been considered to be sample shots for the leading wafer in a lot and the jump shots in the second wafer and the subsequent wafers have been determined, sample shots to be measured may be selected from all shot areas in the leading wafer. Furthermore, for all wafers, the alignment errors of a predetermined number of sample shots are respectively measured, and based on the respective measurement results, respective jump shots are determined, and with the sample shots left in each wafer, alignment may be performed by an EGA method.

In addition, in this embodiment the function $G_n$ has been expressed as $n^{1/2}$ by Equation (4). However, when a result of measurement is not a Gaussian distribution, the function $G_n$ may be set according to the distribution to a predetermined function of n.

(C) Second Method of Removing a Jump Shot

A description will hereinafter be made of a method of excluding a jump shot using the focus position detecting system comprising the light emitting system 11 and the light receiving system 13 of FIG. 8. In the wafer 4 of FIG. 9(a), a jump shot is to be removed from N sample shots $SA_1$ to $SA_N$. First an operation to the Z direction is locked with the wafer stage 6 and, based on the array coordinates on the sample coordinate system (x, y) of each sample shot $SA_i$, the wafer stage 6 is driven so that the formation areas of the wafer marks $MX_i$ and $My_i$ of each sample shot $SA_i$ cross the position (measuring point) where a slit image is projected by the focus position detecting system. At this time, the focus signal processing system 14 obtains the surface roughness of the formation areas of the wafer marks $MX_i$ and $My^i$ using the focus signal from the light receiving system 13, and the data on surface roughness distribution is supplied to the main control system 9.

The main control system 9 obtains the pitch of the wafer marks in the measuring direction and the step of the surface roughness from the surface roughness distribution, and for example, when the step of the surface roughness of a wafer does not reach a predetermined allowable value, a sample shot to which that wafer mark belongs is removed as a jump shot. If the position of a wafer mark, where the formation condition is bad, is measured by the alignment system, the occurrence probability of a measurement error which is a nonlinear error component will be high, so the above-described sample shot is to be removed in advance as a jump shot. With this, a sample shot in which the possibility of a jump shot is high can be removed without measuring it by the alignment system.

While the TTL type alignment system has been used in the first embodiment as an alignment system, an off-axis type alignment system or a through-the-reticle type alignment system (TTR) may be used. Also, although a single wafer mark for X-axis and a single wafer mark for Y-axis have been provided according to the first embodiment in each sample shot, three or more wafer marks may be provided in each sample shot. In addition, all wafer marks of each sample shot do not always need to be measured.

Figure 18:
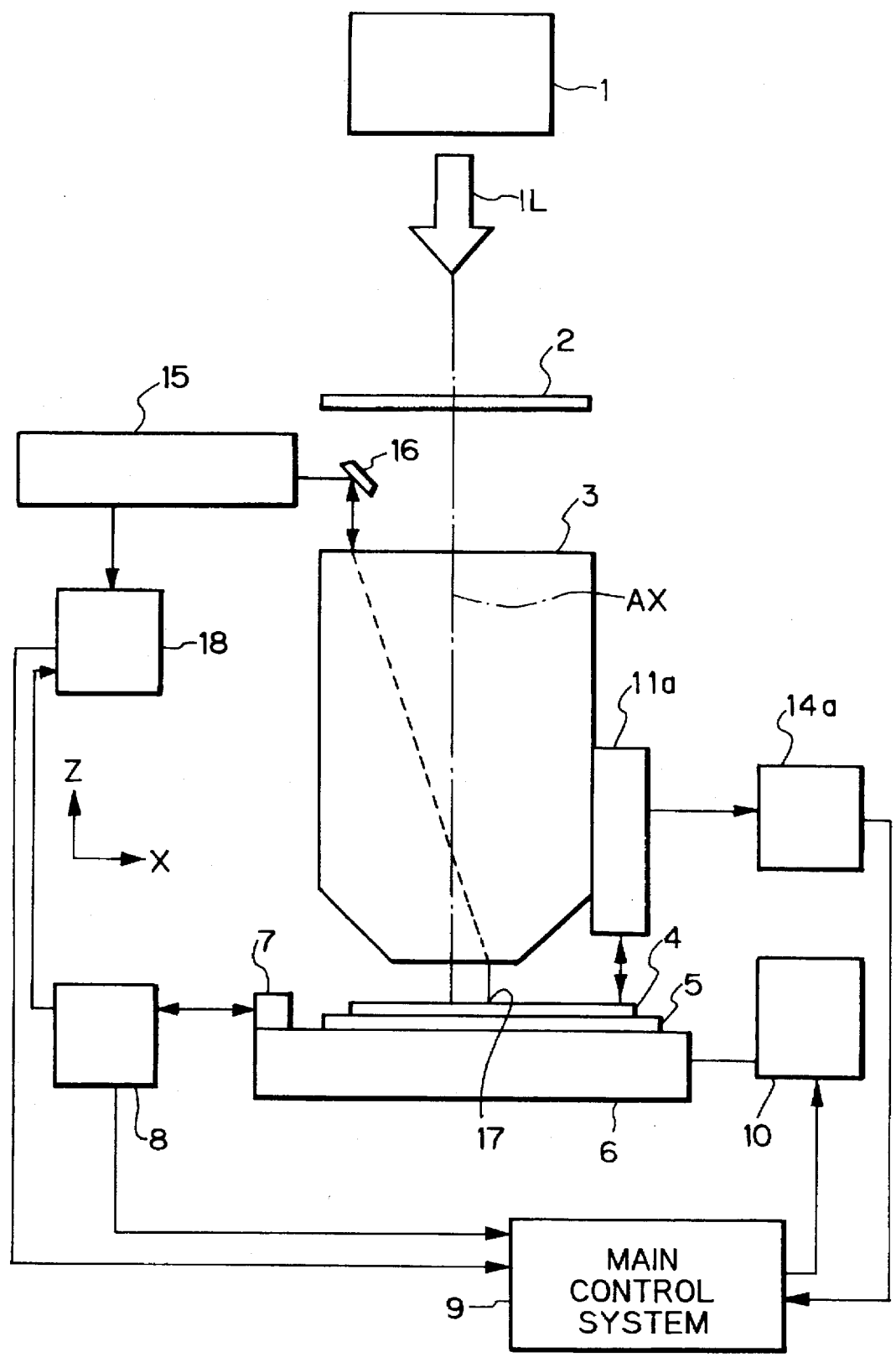
FIG. 18 is a schematic view showing a projection exposure system where alignment methods of second to fourth embodiments of the present invention is applied.

FIG. 18 shows a schematic structure of a projection exposure apparatus which executes other embodiments of the alignment method of the present invention. Since the projection exposure apparatus shown in FIG. 18 has members similar to those of the projection exposure apparatus shown in FIG. 8, a description of the similar members will be omitted.

The projection exposure apparatus shown in FIG. 18 is provided with an off-axis type and image pick-up type alignment system 11a for detecting coordinates of wafer marks formed on each shot region on the wafer 4. Note that an LSA type may be used as the alignment system 11a.

In this case, an image pick-up element for X axis and an image pick-up element for Y axis are incorporated into the alignment system 11a, and image signals, obtained by imaging a wafer mark with the two image pick-up elements, are supplied to an image signal processing system 14a. The coordinates (X, Y), measured by means of a laser interferometer 8, are also supplied to the image signal processing system 14a. The image signal processing system 14a detects the X coordinate (in a case of a wafer mark for Y axis, Y coordinate) as the image of the X-axis wafer mark of an object of detection, for example, matches with a predetermined index mark, and then supplies the detected X coordinates to a main control system 9. With this, the main control system 9 recognizes the coordinates (X, Y) of the wafer marks of shot areas of objects of detection on the wafer 4.

On the other hand, a laser beam for detection, emitted from an alignment optical system 15, is incident on a projection optical system 3 via a mirror 16 for bending an optical path, and the laser beam having passed through the projection optical system 3 is condensed on the wafer 4 as a light spot 17 in the form of a slit elongated in the Y direction, as shown in FIG. 9(b). A wafer stage 6 shown in FIG. 18 is then driven and the X-axis wafer mark of an object of detection on the wafer 4 is so moved as to cross the light spot 17 in the X direction. The wafer marks $M_{xi}$ are marks in which a plurality of rows of patterns comprising dot rows arranged at in the Y direction predetermined pitches are arranged in the X direction. Since diffracted light is emitted in a predetermined direction when the wafer mark $M_{xi}$ crosses the light spot 17, the X coordinate of the wafer mark $M_{xi}$ is detected.

Returning to FIG. 18, the diffracted light of the light spot 17 on the wafer 4 by the wafer mark returns to the alignment optical system 15 via the projection optical system 3 and the mirror 16. Then, the alignment optical system 15 supplies an alignment signal obtained by the photoelectric conversion of the diffracted light to an alignment signal processing system 18. At this time, the coordinates (X, Y) measured by the laser interferometer 8 have also been supplied to the alignment signal processing system 18. The alignment signal processing system 18 detects the X coordinate as the light spot 17 is at the center position of the X-axis wafer mark, and supplies the detected X coordinate to a main control system 9. Also, an alignment optical system (not shown) for Y axis is provided, and the Y coordinate corresponding to the wafer mark for Y axis is detected by the alignment optical system and the alignment signal processing system 18. The detected Y coordinate is also supplied to the main control system 9.

The basic alignment operation of the projection exposure apparatus of this embodiment is performed as follows. First the wafer 4 is placed on a wafer holder 5 of FIG. 18 and then the main control system 9 moves the wafer 4 in the X-Y plane through a wafer stage drive system 10 and the wafer stage 6. The wafer mark of the sample shot on the wafer 4 is set in the vicinity of the position where a light spot is illuminated from the alignment optical system 15 (or the alignment optical system for Y axis). The pre-alignment or rough alignment of the wafer 4 in this case is performed, for example, based on the coordinates of each shot area prescribed on the coordinate system on the wafer 4. Thereafter, the wafer 4 is moved in either the X direction or the Y direction, and the coordinates of the wafer mark are measured with a high degree of accuracy by the alignment signal processing system 18. Using the coordinates of the wafer mark of each sample shot measured in this way, the main control system 9 calculates array coordinates on the stage coordinate system (X, Y) of all shot regions or areas on the wafer 4, as will be described later. Based on the result of this calculation, the pattern images on the reticle 2 are transferred on the shot areas by step-and-repeat process. Note that an off-axis type alignment system may be used as the alignment system 11a.

A detailed description will hereinafter be made of second and third embodiments of the alignment method of the present invention.

(A1) Basic Alignment Method

The basic alignment method of the second and third embodiments is substantially identical to the above-described alignment method (A) of the first embodiment. Therefore, the basic alignment method of the first embodiment is applied to this basic alignment method of the second and third embodiments, and a detailed description will be omitted.

(D) Third Method of Removing a Jump Shot

A method of removing a jump shot, which is the second embodiment of the present invention, will be described in reference to a flowchart of FIG. 19A and FIG. 19B. In this case, the shot array on the wafer 4 is assumed to be an array such as that shown in FIG. 21(a), and 10 sample shots $SA_1$ to $SA_{10}$ are selected from the shot areas. That is, the number N of sample shots is 10. Also, in the following example the number N of sample shots is 6 or more.

Figure 19A:
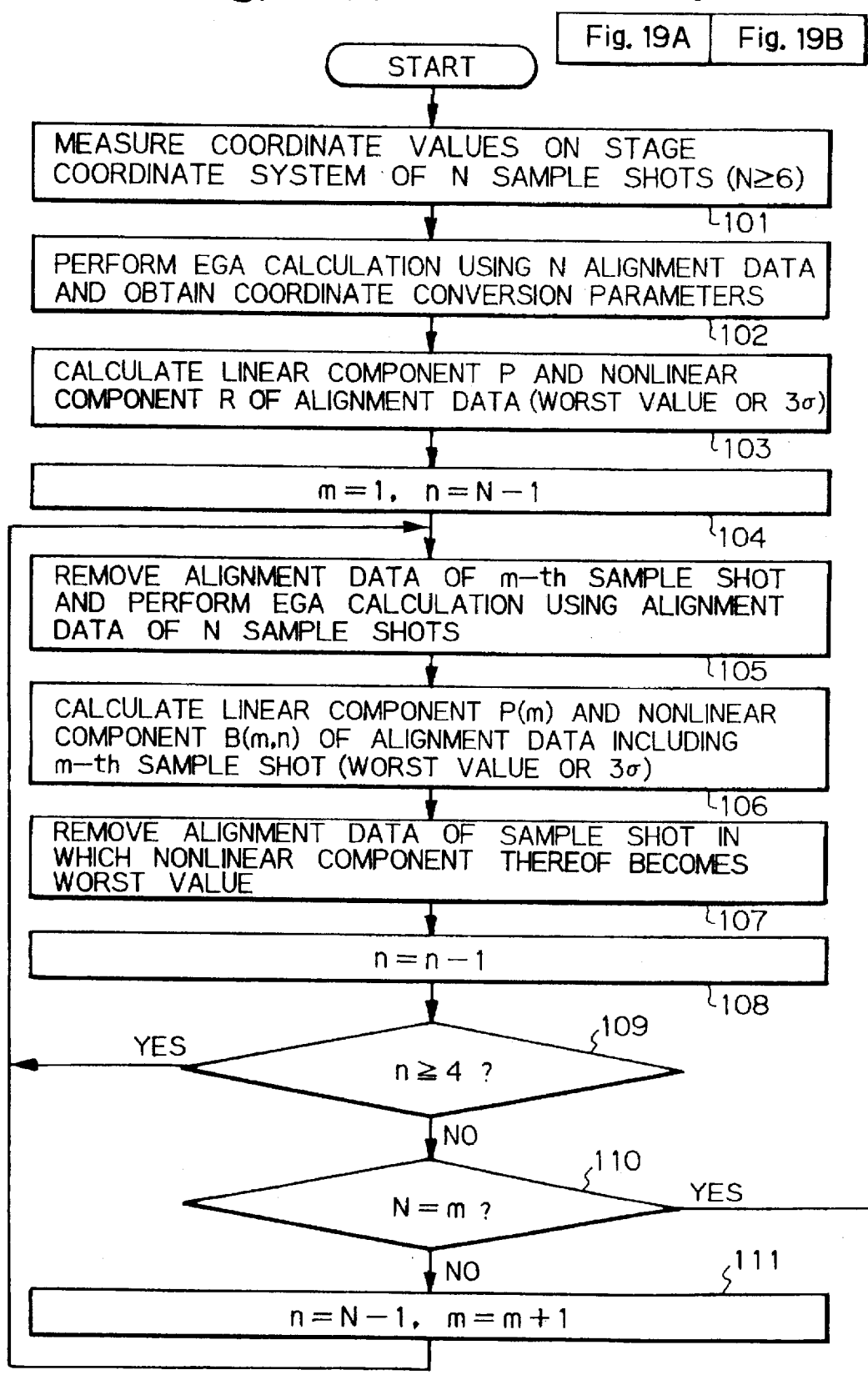
FIG. 19 is a view showing a relationship between FIG. 19A and 19B, and FIGS. 19A and 19B show a flowchart showing the second embodiment of the alignment method of the present invention.
Figure 19B:
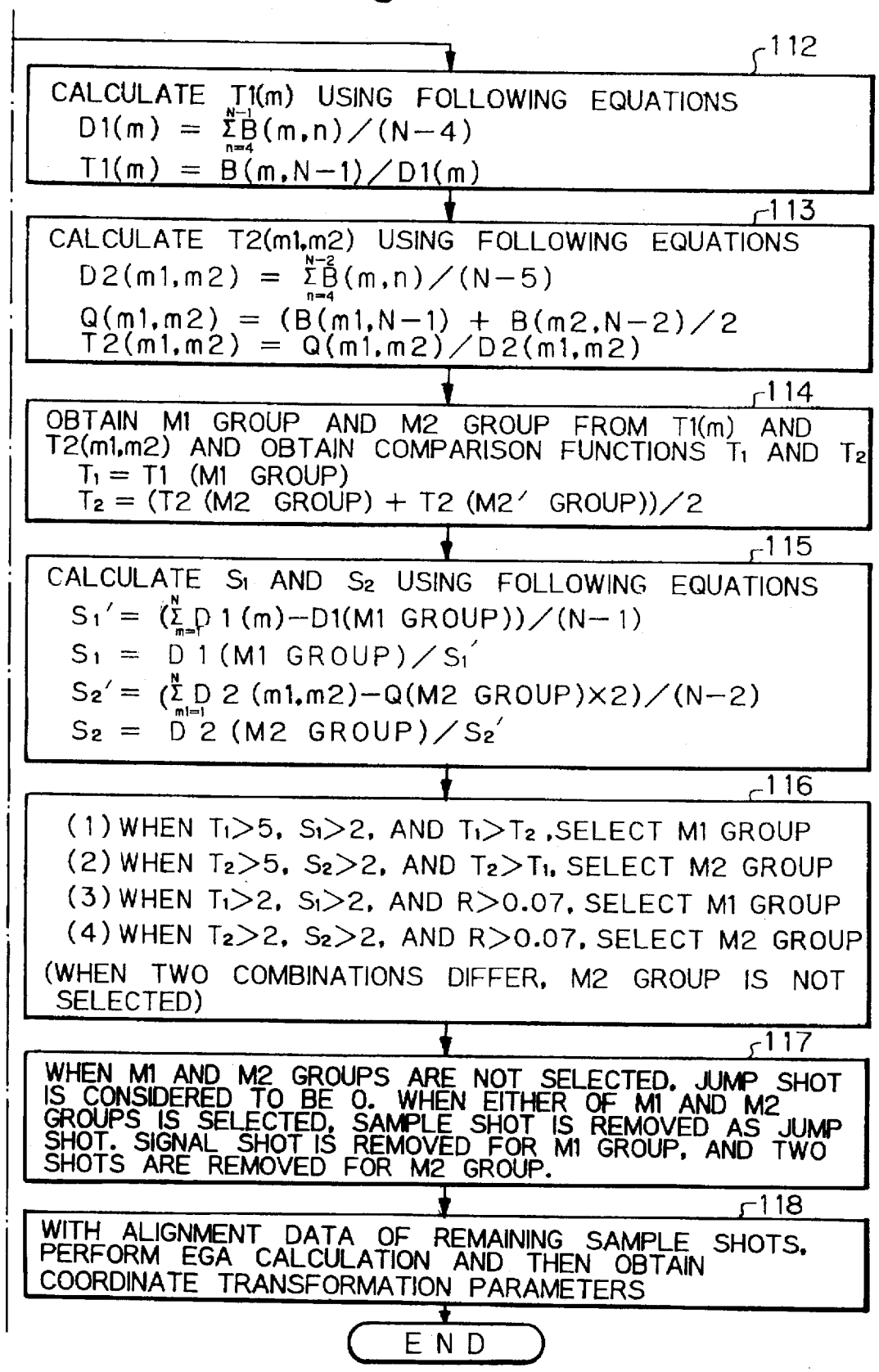

First, in step 101 of FIG. 19A the coordinate values on the stage coordinate system (X, Y) of N (N=10) sample shots $SA_1$ to $SA_N$ are measured, and in step 102 the values of six transformation parameters of Equation (1) are determined with the N measured coordinate values (alignment data) ($XM_i$, $YM_i$) by EGA calculation.

Thereafter, in step 103 the linear components P of the alignment errors (linear error components) are obtained by subtracting design array coordinates ($x_i$, $y_i$) from the calculated array coordinates ($X_i$, $Y_i$) (i=1 to N) of each sample shot obtained by substituting the determined transformation parameters in Equation (1). Then, the vectors ($XM_i$-$X_i$, $YM_i$-$Y_i$) of the nonlinear component of the alignment error (nonlinear error component) are obtained by subtracting the calculated array coordinates ($X_i$, $Y_i$) from the measured coordinate values (alignment data) ($XM_i$, $YM_i$). The worst maximum value of the absolute value of the vector of N nonlinear components or three times the standard deviation of the absolute values of the vectors of N nonlinear components (this three times the standard deviation is referred to as NLE(3σ)), is obtained. The maximum value or NLE(3σ) is set to a function R representative of the nonlinear component of the alignment data.

Figure 21A:
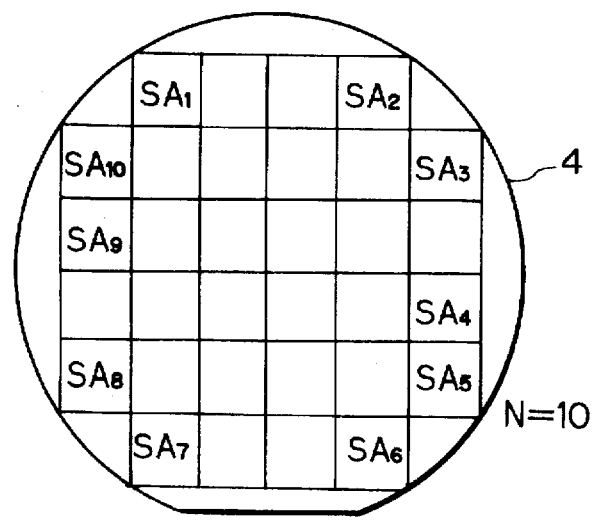
FIGS. 21(a) to 21(c) are diagrams showing the array of the sample shots including a jump shot, in the second and third embodiments.

Next, sample shots are sequentially removed one by one from N sample shots of FIG. 21(a). For this purpose, in step 104 a variable m is set to 1 and a variable n is set to (N−1) for initialization.

Figure 21B:
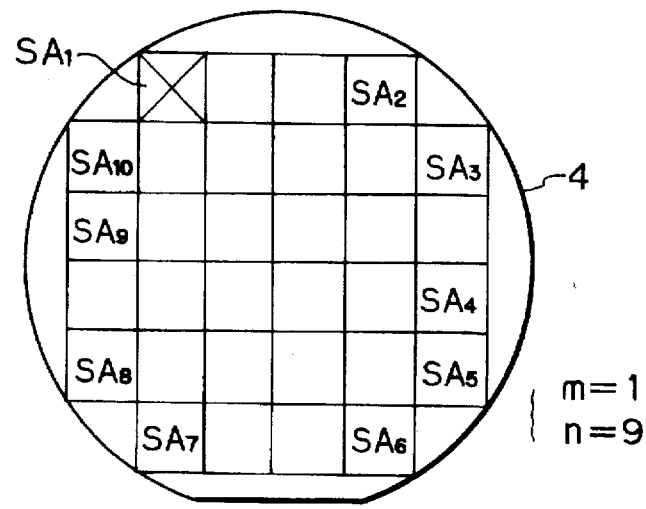

In this case, the variable m represents the order of a sample shot which is removed from the N sample shots, and the variable n represents the number of the remaining sample shots. For example, when the variable m is 1, it means that the measured data (alignment data) of the first sample shot $SA_1$ is removed, as shown in FIG. 21(b). In step 105, using the alignment data of the remaining n (in FIG. 21(b) n=9) sample shots obtained by excluding the m-th sample shot, the values of six transformation parameters of Equation (1) are determined by EGA calculation. In step 106, offsets from a designed value (alignment error) of the alignment data of (n+1) sample shots, including the m-th sample shot, are divided into linear components and non-linear components. The maximum value of the absolute values of the vectors of the n linear components, or three times the standard deviation is set to a linear component P(m). Also, the maximum value of the absolute values of the vectors of the n nonlinear components, or three times the standard deviation NLE(3σ), is set to a nonlinear component B(m, n).

Thereafter, the alignment data of a sample shot in which the absolute value of the vector of the nonlinear component thereof is largest among the n sample shot obtained by excluding the m-th sample shot obtained in step 106, i.e., in which the nonlinear component becomes a worst value, is removed (step 107) and then the number (n−1) of the remaining sample shots is again set to n (step 108). And, whether the number n of the remaining sample shots is four or more is determined in step 109. When the number n is four or more, steps 105 through 109 are executed. In other words, EAG calculation is performed for sample shots which are smaller than previous sample shots by one, and the linear components and the nonlinear components of the alignment errors of (n+1) sample shots are obtained. Also, the linear components P(m) and the nonlinear components B(m, n) are obtained. Then, a sample shot where the nonlinear component thereof becomes a worst value is removed from n sample shots.

Figure 21C:
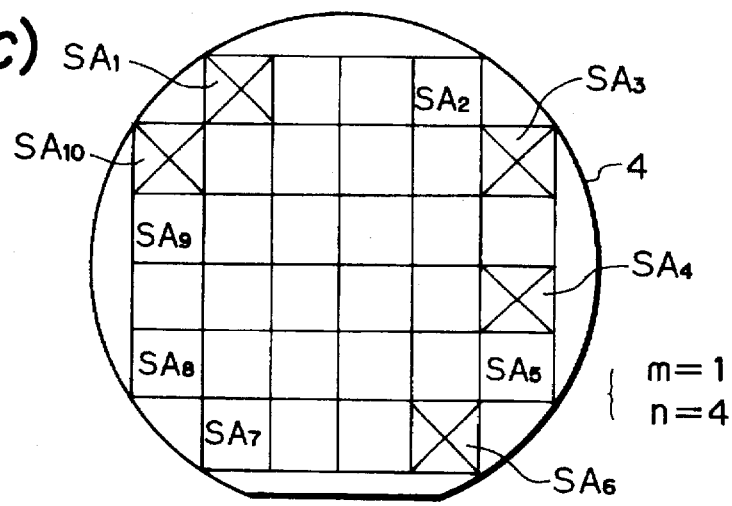

By repeating this operation, the nonlinear components B(1, N−1), B(1, N−2), B(1, N−3), ..., and B(1, 4) are obtained and stored, when the order m is one. For example, if sample shots are removed in order of $SA_1 \rightarrow SA_3 \rightarrow SA_{10} \rightarrow SA_6 \rightarrow SA_4$, as shown in FIG. 21(c), the order of sample shots which are thus removed will be stored.

If the number n of sample shots becomes 3 in step 109, the step will advance to step 110. In step 110, whether the order m of a sample shot to be first removed has reached N is checked. If the order m is not N, the order will be set to (m+1) and the number n of the remaining sample shots will be set to (N−1) (step 111). Then, with that state as an initial state, the operation of the steps 105 to 110 is again repeated. With this, the nonlinear components B(2, N−1), B(2, N−2), ..., and B(2, 4) are obtained. Also, the order of sample shots to be removed is stored.

Furthermore, by repeating steps 105 to 111 until the order m of a sample shot to be first removed reaches N, N kinds of nonlinear components B(m, n) (m =1 to N, n=(N−1) to 4) are obtained and the order of sample shots to be removed at that time are obtained. At the time when the order m has reached the number N of sample shots step 110 advances to step 112. For N kinds of nonlinear components B(m, n), average values D1(m) are obtained in a range where the value of the variable n is between (N−1) and 4. If the sum of the average values as the variable n changes from (N−1) to 4 is expressed in terms of a summation symbol Σ, the following equation will be obtained.

$$D1(m) = \Sigma D(m, n)/(N-4) \qquad (8)$$

Moreover, a function T1(m), which represents how large the nonlinear component B(m, N−1) of the first removed sample shot is with respect to the average value D1(m), is obtained from the following equation.

$$T1(m) = B(m, N-1)/D1(m) \qquad (9)$$

Next, in step 113, functions D2(m1, m2) and T2(m1, m2) as jump shots are assumed to be 2 are obtained. For N kinds of nonlinear components B(m, n), the function D2(m1, m2) is an average value which is obtained in a range where the value of the variable n changes from (N−2) to 4. If the sum of the average values as the variable n changes from (N−2) to 4 is expressed in terms of the summation symbol Σ, the following equation will be obtained.

$$D2(m1, m2) = \Sigma B(m, n)/(N-5) \qquad (10)$$

In this case, integer m represents the order of a first removed sample shot, and integer m2 represents the order of a second removed sample shot. Next, the average value of the nonlinear components B(m1, N−1) and B(m2, N−2) is defined as Q(m1, m2), and a function T2(m1, m2) is defined as follows.

$$Q(m1, m2) = \{B(m1, N-1) + B(m1, N-2)\}/2$$

$$T2(m1, m2) = Q(m1, m2)/D2(m1, m2) \qquad (11)$$

Thereafter, in step 114, a sample shot group (hereinafter referred to as a M1 group), which has been removed when the value of the function T1(m) is largest, is obtained, and the value of integer m in the M1 group, i.e., the value of integer representative of a first removed sample shot is obtained. When the value of the function T1(m) is maximum in the case of FIG. 21(c), the M1 group is sample shots $SA_1$, $SA_3$, $SA_{10}$, $SA_6$, and $SA_4$, and the value of the integer m of the M1 group is 1.

Next, a sample shot group (hereinafter referred to as a M2 group), which has been removed when the value of the function T2(m1, m2) is largest, is obtained, and a combination of integers m1 and m2 in the M2 group, i.e., the values of integers representative of first and second removed sample shots are obtained. Also, a sample shot group (hereinafter referred to as a M2' group), which has been removed when the value of the function T2(m1, m2) is second largest, is obtained, and a combination of integers m1 and m2 in the M2' group is obtained. When the value of the function T2(m1, m2) is maximum in the case of FIG. 21(c), the M2 group is sample shots $SA_1$, $SA_3$, $SA_{10}$, $SA_6$, and $SA_4$, and the values of the integers m1 and m2 of the M2 group are 1 and 3.

Note that when the number of jump shots is, for example, two, the first and second sample shots of the M2 group should be identical with the second and first sample shots of the M2' group. In other words, the values of the integers m1 and m2 of the M2 group must be the same as those of the integers m2 and m1 of the M2' group, respectively. Then, when a combination of the integers m1 and m2 of the M2 group differs from a combination of the integers m2 and m1 of the M2' group, the M2 group is not selected because there is no reliability in the evaluation result. This operation where the M2 is not selected is shown in step 116 to be described later. And, if the value of the function T1(m) in the M1 group is expressed by a function $T_1$ and an average value of the function T2(m1, m2) in the M2 group and the function T2(m1, m2) in the M2' group is expressed by a function $T_2$, the functions $T_1$ and $T_2$ will become as follows.

$$T_1 = T1(M1\ Group) = \max(T1(m)), \quad (12)$$

$$T_2 = \{T2(M2\ Group) + T2(M2'\ Group)\}/2$$

$$= \{\max(T2(m1, m2)) + \text{next}(T2(m1, m2))\}/2$$

where max(T1(m)) is a function which calculates the maximum value of the function T1(m) (m=1 to N), max(T2(m1, m2)) is a function which calculates the maximum value of the function T2(m1, m2) (m1, m2=1 to N; m1≠m2), and next(T2(m1, m2)) is a function which calculates the second largest value of the function T2(m1, m2).

The functions $T_1$ and $T_2$ defined as described above are comparison functions as the m-th sample shot is first removed and then sample shots are removed in sequence.

In step 115 another set of comparison functions $S_1$ and $S_2$ are obtained. These comparison functions are functions which represent how much greater the comparison functions $T_1$ and $T_2$ which are obtained when the M1 and M2 groups are selected are than those when other sample shots are selected. The comparison functions are expressed by the following equations. In these equations, the summation symbol Σ represents the sum as integer m or m1 changes from 1 to N. Also, although functions $S_1'$ and $S_2'$ are used in step 115 of FIG. 19, the calculation result is the same.

$$S_1 = D1(M1\ Group)/\{(\Sigma D1(m) - D1(M1\ Group))/(N-1)\},$$

$$S_2 = D2(M2\ Group)/\{(\Sigma D2(m1, m2) - Q(M2\ Group)\cdot 2)/(N-2)\} \quad (13)$$

Using the comparison functions $T_1$, $T_2$, $S_1$, and $S_2$ thus obtained and the function R of the nonlinear component obtained in step 103, it is determined in step 116 whether or not a jump shot exists. To determine whether a jump shot exists, the following logic equations are used.

(1) When $T_1 > 5$, $S_1 > 2$, and $T_1 > T_2$ are established, a jump shot is determined to be one and the M1 group is selected. This means that the nonlinear component B(m, N−1) in the sample shot first removed by Equation (9) is five times greater than the average value D1(m), that by Equation (13) the comparison function $T_1$ of the M1 group is twice that than when other sample shots are selected, and that the comparison function $T_1$ of the M1 group is greater than the comparison function $T_2$ of the M2 group.

(2) When $T_2 > 5$, $S_2 > 2$, and $T_2 > T_1$ are established, jump shots are determined to be two and the M2 group is selected. However, when a combination of m1 and m2 of the M2 group differs from a combination of m2 and m1 of the M2' group, the M2 group is not selected, as described in step 114. The same is true of the following (4).

(3) When $T_1 > 2$, $S_1 > 2$, and $R > 0.07$ are established, a jump shot is determined to be one and the M1 group is selected.

(4) When $T_2 > 2$, $S_2 > 2$, and $R > 0.07$ are established, jump shots are determined to be two and the M2 group is selected.

In cases other than the above-described (1) to (4), it is determined that no jump shot exists. That is, in step 117, a jump shot is determined to be 0 when the M1 group and the M2 group have not been selected. Also, when the M1 group is selected, a jump shot is determined to be one (sample shot which is determined by the integer m of the M1 group), and when the M2 group is selected, jump shots are determined to be two (sample shots which are determined by the integers m1 and m2 of the M2 group). Selected jump shots are removed.

Figure 1A:
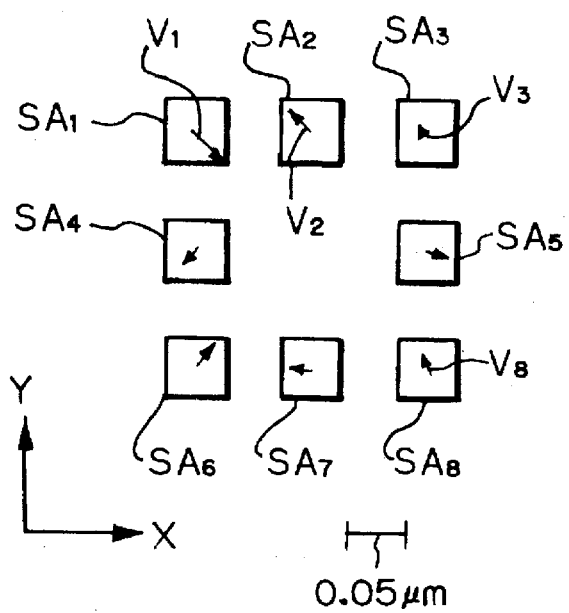
FIG. 1(a) is a diagram showing the conventional array of sample shots where there is no jump shot.
Figure 2:
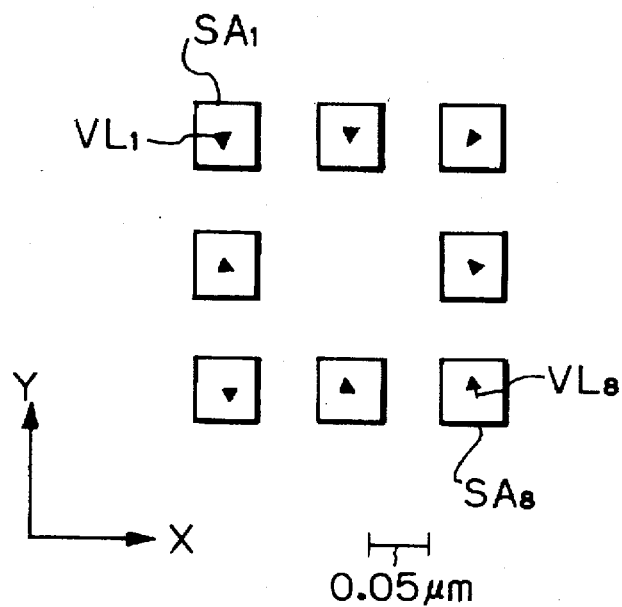
FIG. 2 is a diagram showing the linear error component vectors in the sample shot array of FIG. 1(a)
Figure 4:
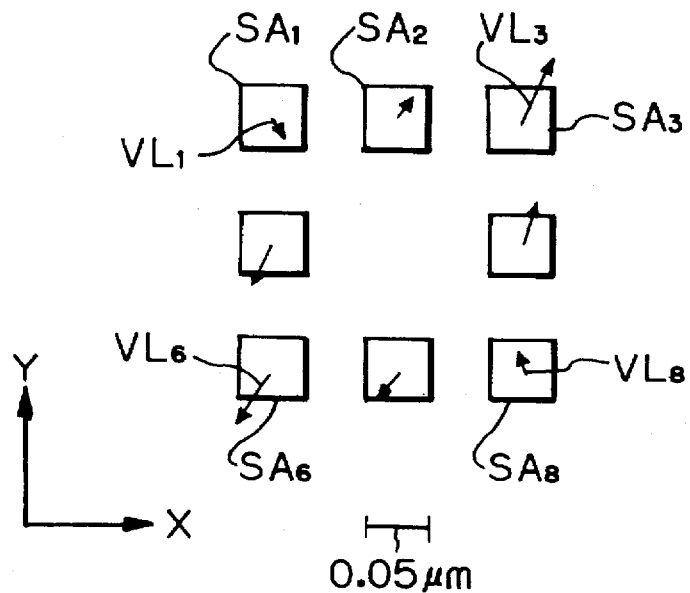
FIG. 4 is a diagram showing the linear error component vectors in the sample shot array of FIG. 3(a)
Figure 3A:
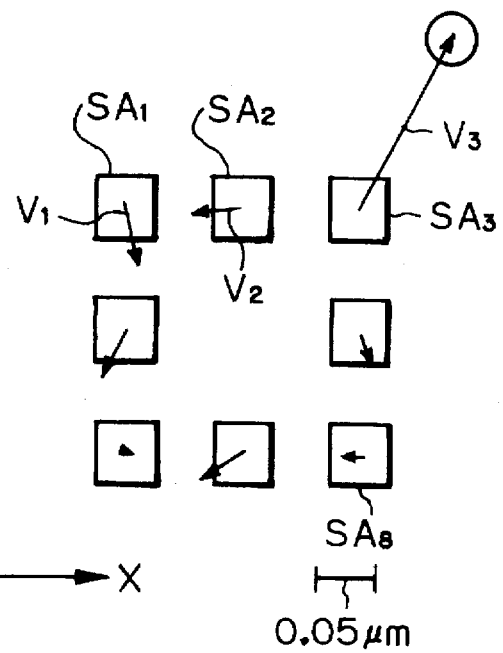
FIG. 3(a) is a diagram showing the conventional array of sample shots which include a jump shot.
Figures 5A, 5B:
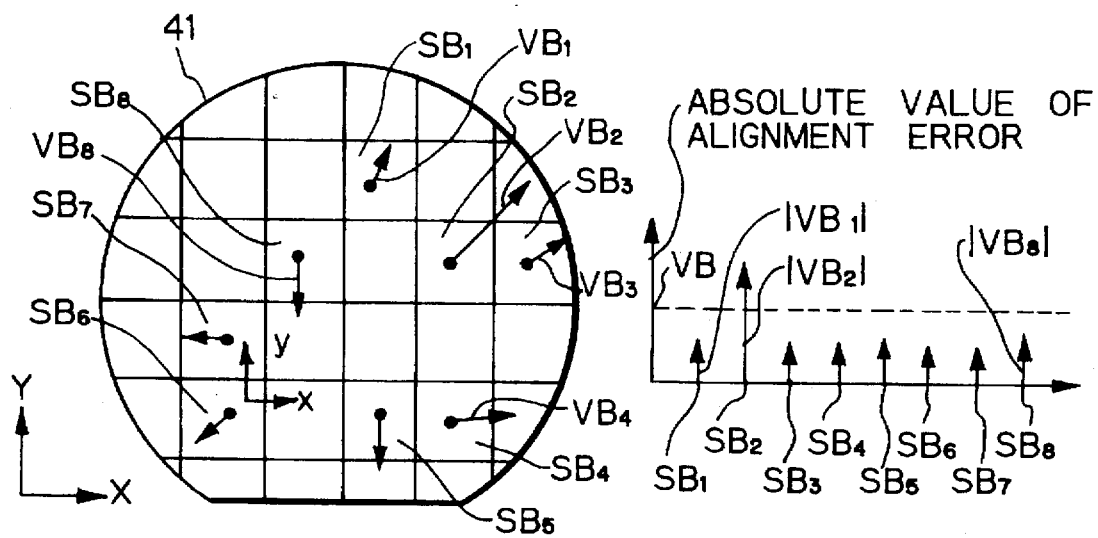
FIGS. 5(a) and 5(b) are diagrams used to explain an example of a conventional method of rejecting a jump shot, FIG. 5(a) showing array of sample shots and FIG. 5(b) showing an absolute value of an alignment error in each sample shot.
Figures 6A, 6B:
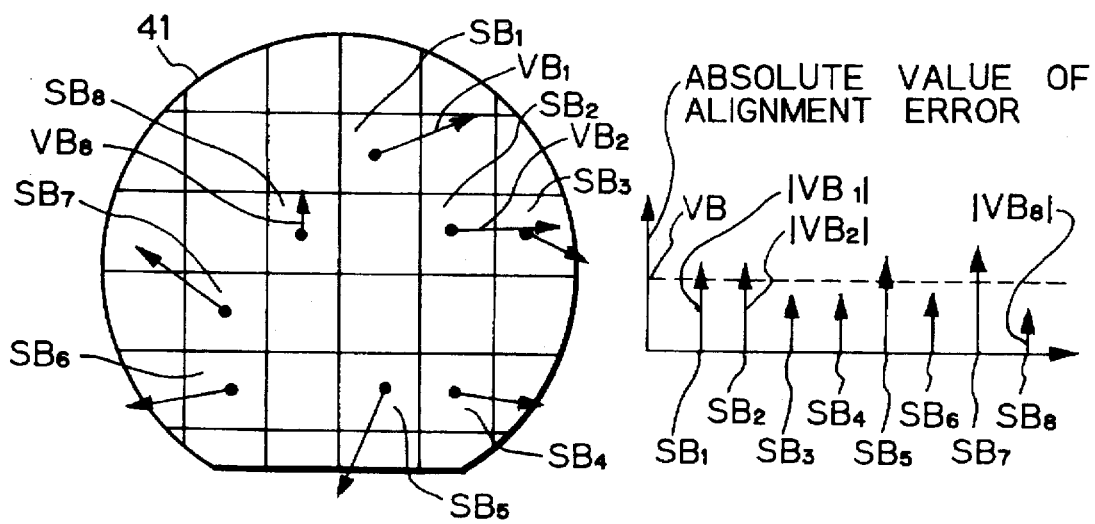
FIGS. 6(a) and 6(b) are diagrams used to explain another example of a conventional method of rejecting a jump shot, FIG. 6(a) showing an array of sample shots and FIG. 6(b) showing an absolute value of an alignment error in each sample shot.
Figures 7A, 7B:
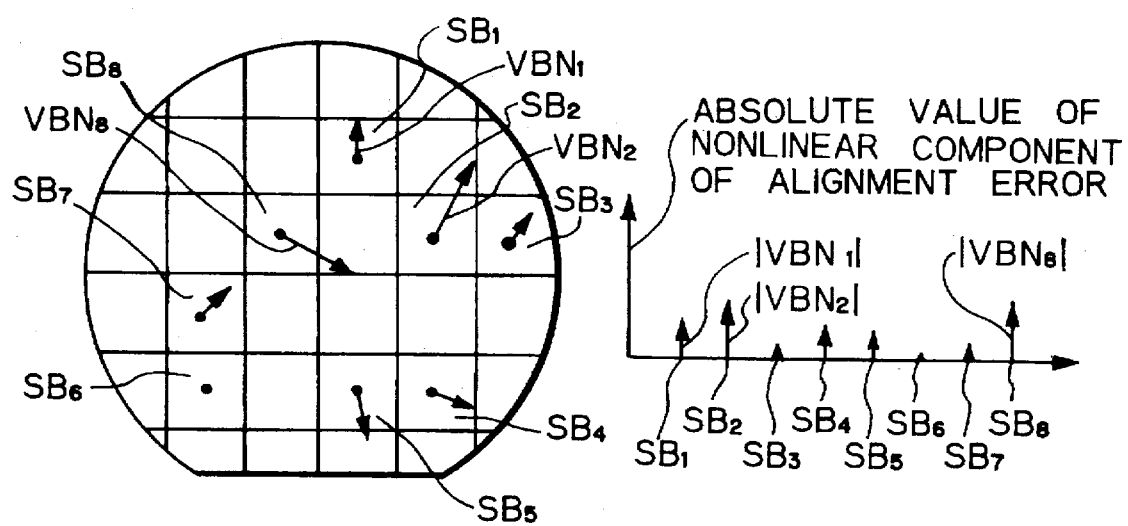
FIGS. 7(a) and 7(b) are diagrams used to explain still another example of a conventional method of rejecting a jump shot, FIG. 7(a) showing an array of sample shots and FIG. 7(b) showing an absolute value of the nonlinear component of an alignment error in each sample shot.

Thereafter, in step 118, the six coordinate transformation parameters of Equation (1) are determined by performing EGA calculation using the alignment data of the remaining sample shots. Then, by substituting the thus obtained six coordinate transformation parameters and the design array coordinates of each shot area $ES_i$ (i=1 to M) on the wafer 4 of FIG. 21(a) into the right side of Equation (1), the calculated array coordinates of each shot area $ES_i$ are obtained. Based on the calculated array coordinates, the center of each shot region $ES_i$ is set at the exposure center of the projection optical system 3 of FIG. 3, and pattern images on the reticle 2 are transferred on the wafer 4. With this, the influences of jump shots are alleviated and pattern images on the reticle are exposed with high alignment accuracy.

In the second embodiment described above, as shown in step 105, the alignment data of the m-th sample shot has been removed and EGA calculation has been performed with the alignment data of n sample shots. Therefore, when the m-th sample shot is a jump shot, coordinate conversion parameters are accurately obtained because the remaining data include a large number of accurate data. And, since the nonlinear error components of the alignment data, including the m-th sample shot, has been calculated again in the next step 106, how large the nonlinear error component of the jump shot is can be determined accurately.

Also, since in step 112 the average value D1(m) of the nonlinear component B(m, n) has been calculated and the function T1(m) has been obtained by dividing the nonlinear component B(m, N−1) by this average value, the reliability of the function T1(m) which becomes an object to be compared is high and a jump shot can be found stably. In addition, since, based on the fact that the number of jump shots is one or two at most, in steps 112 and 113 a function which becomes an object to be compared has been divided into functions T1(m) and T2(m1, m2) and it has been determined whether the number of jump shots is one or two, unlike the prior art when two jump shots exist there is no possibility that finding the jump shots becomes difficult.

Furthermore, since relative comparison and comparison between absolute values have been performed as a method of determining the number of jump shots using comparison functions $S_1$, $S_2$, $T_1$, and $T_2$, as shown in step 116, the reliability with which jump shots are specified has been enhanced. In this case, for example, simulation is performed for absolute values and the highest value of detection rate (in (1) and (2) of step 116, 5 for $T_1$ and $T_2$ and 2 for $S_1$ and $S_2$) is set. Moreover, in a case where the M2 group which makes the function T2(m1, m2) maximum is obtained in step 114, when the function T2(m1, m2) becomes a maximum value as the m1-th and m2-th sample shots are removed in this order, the M2 group is not selected when the function T2(m2, m1) does not become a second largest value as the m2-th and m1-th sample shots are removed in this order. Therefore, deterioration in accuracy which is caused by mistaken detection is prevented.

Furthermore, when the function R of the nonlinear component, obtained in step 103, is small, removing a jump shot deteriorates alignment accuracy. For this reason, when the function R is less than a predetermined threshold value (in step 116, for example, 0.07), it has been determined, in the above-described (3) and (4) of step 116, that no jump shot exists. Therefore, when the function R of the nonlinear component is small, deterioration in accuracy has been prevented.

Figure 20B:
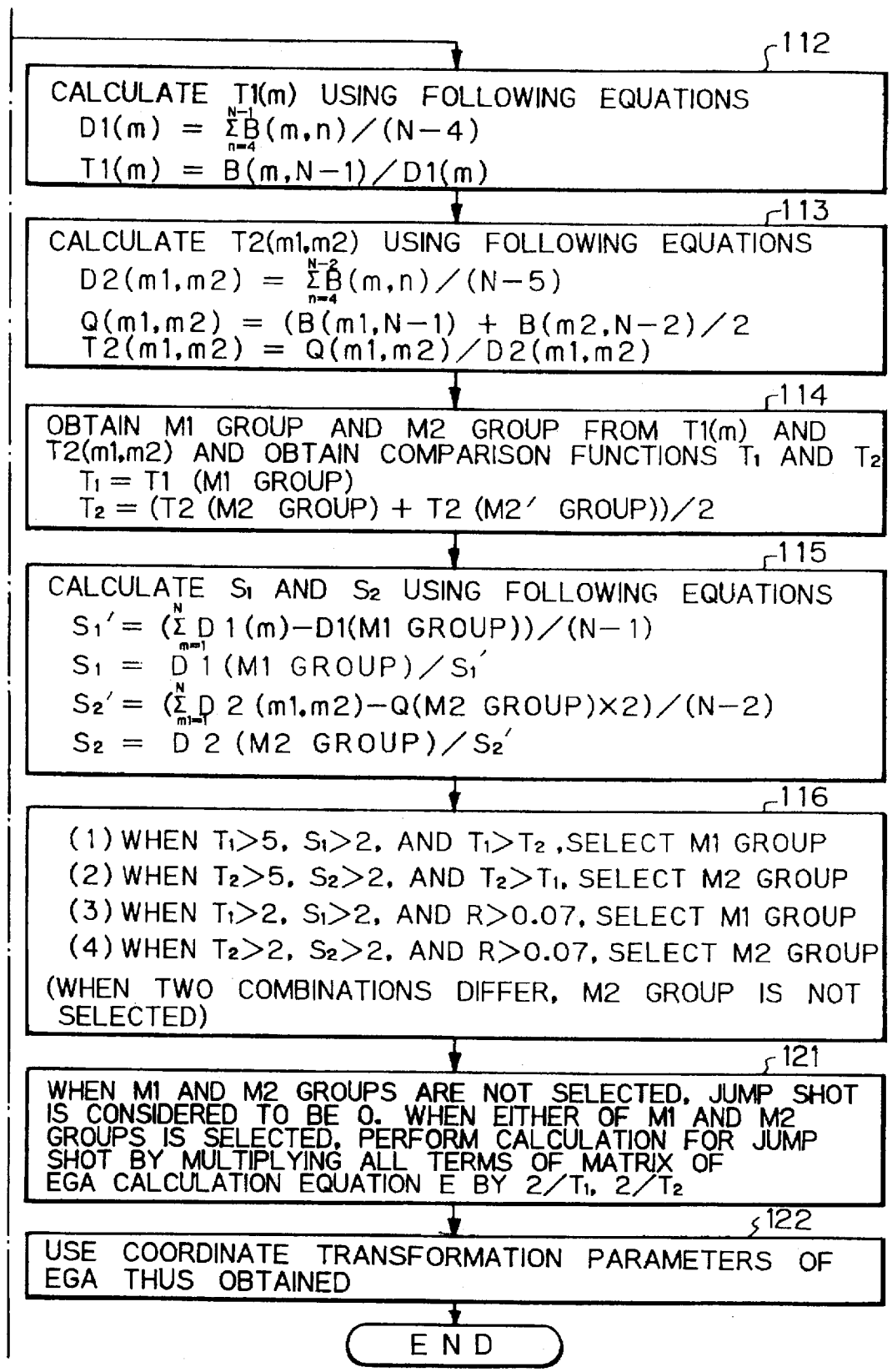
FIG. 20 is a view showing a relationship between FIG. 20A and FIG. 20B, and FIGS. 20A and 20B show a flowchart showing the third embodiment of the alignment method of the present invention.

A third embodiment of the alignment method of the present invention will hereinafter be described in reference to a flowchart of FIG. 20A and FIG. 20B. In this embodiment, the projection exposure apparatus of FIG. 18 is also used and the wafer 4 of FIG. 21(a) is employed as an object to be exposured. The operation of steps 101 to 116 of this embodiment, shown in FIG. 20, is identical with the operation of steps 101 to 116 of the second embodiment, shown in FIGS. 19A and 19B. Therefore, even in this third embodiment, based on comparison functions $T_1$, $T_2$, $S_1$, and $S_2$ and the function R of the nonlinear component, when no jump shot exists no groups are selected, when a single jump shot exists the M1 group is selected, and when two jump shots exist the M2 group is selected (step 116 of FIG. 20B).

Thereafter, the operation advances to step 121, and the alignment data of a sample shot, which is determined to be a jump shot, is weighted. In this embodiment, two times the reciprocal numbers of the comparison functions $T_1$ and $T_2$ represented in Equation 12 are set to weights. Weights which are respectively applied to N (in FIG. 21(a) N=10) sample shots SAi (i=to N) selected on the wafer 4 of FIG. 21(a) are assumed to be P(i). When the number of jump shots is 1, a jump shot is assumed to be the m-th sample shot and the weight P(i) is set as follows.

$$P(m)=2/T_1, \quad P(i)=1(i \ne m) \tag{14}$$

In this case, if a jump shot exists, the value of the weight P(m) which is applied to the jump shot will become less than 1, because, in step 116, the value of the comparison function $T_1$ is greater than 2.

When the number of jump shots is two, jump shots are assumed to be the m1-th and m2-th sample shots and the weight P(i) is set as follows.

$$P(m1)=2/T_2, \quad P(m2)=2/T_2,$$
$$P(i)=1(i \ne m1, m2) \tag{15}$$

In this case, if jump shots exist, the values of the weight P(m1) and P(m2) which are applied to the jump shots will become less than 1, because, in step 116, the value of the comparison function $T_2$ is greater than 2.

Thereafter, the sum of values, which are obtained by multiplying the second power of the absolute value of the alignment error vector by the second power of the weight P(i), is assumed to be a residual error component as follows. The alignment error vector is obtained by subtracting the actually measured array coordinates ($XM_i$, $YM_i$) from the array coordinates ($X_i$, $Y_i$) calculated by substituting the designed array coordinates ($x_i$, $y_i$) of each sample shot $SA_i$, including a jump shot, into the right side of Equation (1).

$$\text{Residual error component} = \sum_{i=1}^{N} P(i)^2 \{(X_i - XM_i)^2 + (Y_i - YM_i)^2\} \tag{16}$$

Then, the values of the six transformation parameters of Equation (1) are determined so that the residual error component of Equation (16) assumes a minimum value. This is referred to as a "weighting EGA calculation". This is equivalent to obtaining calculated array coordinates by multiplying all terms of the matrix of the right side of Equation (1) by the weight P(i) for each sample shot $SA_i$ and then determining the values of the conversion parameters so that the residual error component of Equation (2) becomes minimum.

Thereafter, the operation advances to step 122. In step 122, by substituting the thus obtained six coordinate transformation parameters and the design array coordinates of each shot area $ES_i$ (i=1 to M) on the wafer 4 into the right side of Equation (1), the calculated array coordinates of each shot area $ES_i$ are obtained. Then, based on the calculated array coordinates, the alignment of each shot area $ES_i$ is performed and pattern images on the reticle 2 are exposed.

Thus, in the second and third embodiments, instead of removing the jump shot which is detected, a predetermined weight is applied according to the sizes of the comparison functions $T_1$ and $T_2$ to a jump shot detected, and transformation parameters are calculated. Therefore, the stability of the finally obtained array coordinates of each shot area has been enhanced.

A detailed description will hereinafter be made of an alignment method of a fourth embodiment of the present invention. This alignment method is also executed by the projection exposure apparatus shown in FIG. 18.

(A2) Basic Alignment Method

The basic alignment method of this embodiment is substantially identical with the above-described alignment method (A) of the first embodiment. Therefore, the basic alignment method of the first embodiment is applied to this basic alignment method of the fourth embodiment, and a detailed description will be omitted.

(E) Fourth Method of Removing a Jump Shot

A method of removing a jump shot, which is the fourth embodiment of the present invention, will be described in reference to flowcharts of FIG. 22A and FIG. 22B. In this case, the shot array on the wafer 4 is assumed to be a shot array such as that shown in FIG. 21(a), and ten sample shots $SA_1$ to $SA_{10}$ are selected from the shot areas. That is, the number N of sample shots is ten. Also, in the following example the number N of sample shots is six or more.

Figure 22A:
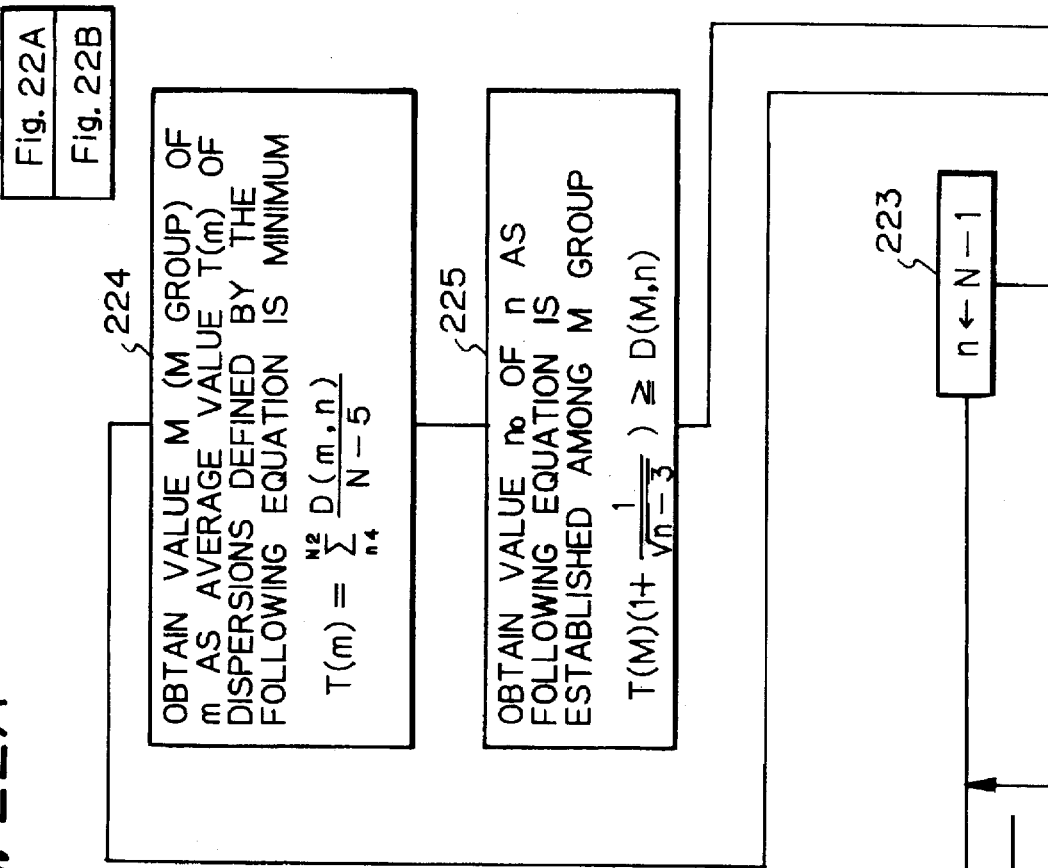
FIG. 22 is a view showing a relationship between FIG. 22A and FIG. 22B, and FIGS. 22A and 22B show a flowchart showing the fourth embodiment of the alignment method of the present invention.

First, in step 210 of FIG. 22A the coordinate values on the stage coordinate system (X, Y) of N (N=10) sample shots $SA_1$ to $SA_N$ are measured, and in step 211 the values of six transformation parameters of Equation (1) are determined using the N measured coordinate values (alignment data) ($XM_i$, $YM_i$) by EGA calculation.

Thereafter, in step 212 the linear components P of the alignment errors (linear error components) are obtained by subtracting design array coordinates ($x_i$, $y_i$) from the calculated array coordinates ($X_i$, $Y_i$) (i=1 to N) of each sample shot obtained by substituting the determined transformation parameters into Equation (1). Then, the vectors ($XM_i$-$X_i$, $YM_i$-$Y_i$) of the nonlinear component of the alignment error (nonlinear error component) are obtained by subtracting the calculated array coordinates ($X_i$, $Y_i$) from the measured coordinate values (alignment data) ($XM_i$, $YM_i$). The maximum value of the absolute value of the vector of N nonlinear components, or three times the standard deviation of the absolute values of the vectors of N nonlinear components, (this three times the standard deviation is referred to as NLE(3σ)), is obtained. The maximum value or NLE(3σ) is set to a function R(N) representative of the nonlinear component.

Next, sample shots are sequentially removed one-by-one from N sample shots of FIG. 21(a). For this purpose, in step 213 a variable m is set to 1 and a variable n is set to (N−1) for initialization. Also, an evaluation function D(N, N) is defined as follows.

$$D(N, N)=R(N)/(N-3)^{1/2} \tag{17}$$

In this case, the variable m represents the order of a sample shot which is first removed from the N sample shot, and the variable n represents the number of the remaining sample shots. For example, when the variable m is 1, it means that the measured data (alignment data) of the first sample shot $SA_1$ is removed, as shown in FIG. 21(b). In step 214, with the alignment data of the remaining n sample shots obtained by excluding the m-th sample shot, the values of six transformation parameters of Equation (1) are determined by EGA calculation. In step 215, offsets from a designed value (alignment error) of n alignment data are divided into linear components and nonlinear components. In step 216, the maximum value of the absolute values of the vectors of the n nonlinear components, or three times the standard deviation, NLE(3σ), is set to a function R(n).

Next, in step 217 the evaluation function D(m, n) of the dispersion of the nonlinear component of the alignment error (nonlinear error component) is obtained by substituting the function R(n) into the following equation. Note that, for example, R(n)/(n−3) may be used as the evaluation function D(m, n).

$$D(m, n) = R(n)/(n-3)^{1/2} \quad (18)$$

Thereafter, the alignment data of a sample shot, in which the vector of the nonlinear component thereof is largest among the n sample shots obtained in step 215, namely, the nonlinear component becomes a maximum value, is removed (step 218) and then the number n of the remaining sample shots is set to (n−1) (step 219). And, whether the number n of the remaining sample shots is four or more is determined in step 220. When the number n is four or more, steps 214 through 218 are executed. In other words, EAG calculation is performed for sample shots which are smaller than previous sample shots by one, and the linear and nonlinear components of the alignment error are obtained. After the evaluation function D(m, n) of the dispersion of the nonlinear component is obtained, a sample shot where the nonlinear component thereof becomes a worst value is removed.

By repeating this operation, the evaluation functions of the dispersions of the nonlinear components, D(1, N−1), D(1, N−2), D(1, N−3), ..., and D(1, 4) are obtained and stored, when m is 1. For example, if sample shots are removed in order of $SA_1 \rightarrow SA_3 \rightarrow SA_1 \rightarrow SA_6 \rightarrow SA_4$, as shown in FIG. 21(c), the order of sample shots which are thus removed will also be stored.

If the number n of sample shots becomes 3 in step 220, the step will advance to step 221. In step 221, whether the order m of a sample shot to be first removed has reached N is checked. If the order m is not N, the order will be set to (m+1) (step 222) and the number n of the remaining sample shots will be set to (N−1) (step 223). Then, with that state as an initial state, the operation of the steps 214 to 220 is again repeated. With this, the evaluation functions of the dispersions of the nonlinear components, D(2, N−1), D(2, N−2), ..., and D(2, 4) are obtained. Also, the order of sample shots to be removed is stored.

Furthermore, by repeating steps 214 to 223 until the order m of a sample shot to be first removed reaches N, N kinds of evaluation functions of dispersions of nonlinear components, D(m, n) (m=1 to N, n=(N−1) to 4), are obtained and the order of sample shots to be removed at that time are obtained. At the time that the order m has reached the number N of sample shots step 221 advances to step 224. For N kinds of evaluation functions D(m, n), average values T(m) are obtained in a range where the value of the variable n is between (N−2) and 4. If the sum of the average values as the variable n changes from (N−2) to 4 is expressed in terms of Σ, the following equation will be obtained.

$$T(m) = \Sigma D(m, n)/(N-5) \quad (19)$$

Thereafter, these N average values T(m) (m=1 to N) are compared and then a value M of m as the average value T(m) becomes a minimum value is obtained. When the M-th sample shot is first removed in this way, a combination of sample shots which are removed in sequence is referred to as an M group of sample shots. In the next step 225, among the M group of sample shots, the sample shot, which is removed as the evaluation function D(M, n) becomes smaller than a value obtained by adding a predetermined dispersion to the average value T(M), is considered to be a jump shot. That is, a value $n_o$ of n as the evaluation function D(M, n) first satisfies the following equation is obtained.

$$T(M)\{1+1/(n-3)^{1/2}\} \geq D(M, n) \quad (20)$$

Thereafter, in step 226, among the M group, the alignment data between the first removed M-th sample shot and the (N−$n_o$)-th removed sample shot are removed as data of jump shots. Then, in step 227, the values of the six transformation parameters of Equation (1) are determined with the alignment data of the remaining $n_o$ sample shots by EGA calculation. By substituting these transformation parameters and the designed array coordinates of the shot regions $ES_1$ to $ES_M$ on the wafer 4 into Equation (1), the calculated array coordinates on the stage coordinate system (X, Y) of the shot areas are obtained. Based on these calculated array coordinates, the shot areas are aligned and then pattern images on the reticle 2 are transferred thereto. Thereafter, the operation advances to step 228 and, for example, the next wafer is exposed.

Here, the evaluation function D(m, n) expressed by Equation (18), the average value T(m) of Equation (19), and the threshold value $T(M)\{1+1/(n-3)^{1/2}\}$ of Equation (20) will be described. In general, the offset (alignment error) from a designed position of the array coordinate data (alignment data) measured in step 210 consists of array errors of wafer marks of sample shots, measurement errors of the alignment system, stage position offset errors, and process errors of devices. These errors are either an error of a linear error component which is an error between the position of Equation (1) and the designed position, or an error of a nonlinear error component other than that. However, since the linear error component has been removed by the EGA calculation, i.e., calculation based on a least squares method, only the nonlinear error is considered.

If the nonlinear error is a Gaussian distributional error, the influence at the time of the determination of the linear error will be small. However, a jump shot error larger than the nonlinear error influences largely when the determination of the linear error. Therefore, it becomes necessary that jump shot errors other than errors considered to be Gaussian distributional errors are discriminated and removed. Since, in least squares approximation, a nonlinear error becomes 0 when the number of remaining sample shots is 3 (n=3), a nonlinear error calculated is proportional to $(n-3)^{1/2}$ with respect to the number n of sample shots. Then, in step 217 of this embodiment, a function R(n), which is the greatest value of nonlinear error components or three times the standard deviation (3σ), is multiplied according to the number n of remaining sample shots by $1/(n-3)^{1/2}$, and then an evaluation function D(M, n) which represents a dispersion of a nonlinear error component independently of the number n of sample shots is obtained. The evaluation function D(m, n) represents the size of a dispersion of a nonlinear error component independently of the number n of sample shots. However, when a dispersion distribution is not a Gaussian distribution, a nonlinear error calculated is often proportional to 1/(n−3) and in such a case 1/(n−3) may be used.

And, supposing that the number of jump shots is 2 or less, in step 224, an average value T(m) is obtained by averaging the evaluation functions D(m', n) obtained when the number n of sample shots is between 4 and (N−2). This average value T(m) can be considered to be a constant obtained by standardizing the dispersions of the nonlinear error components of Gaussian distribution with the number n of sample shots. Therefore, when the average value T(m) becomes minimum (m=M), the probability that jump shots are included in the M group is highest because two jump shots can be considered to have already been removed. To specify jump shots from the M group, in step 225 the evaluation functions D(M, n) of the M group are compared like Equation (20).

Figure 23A:
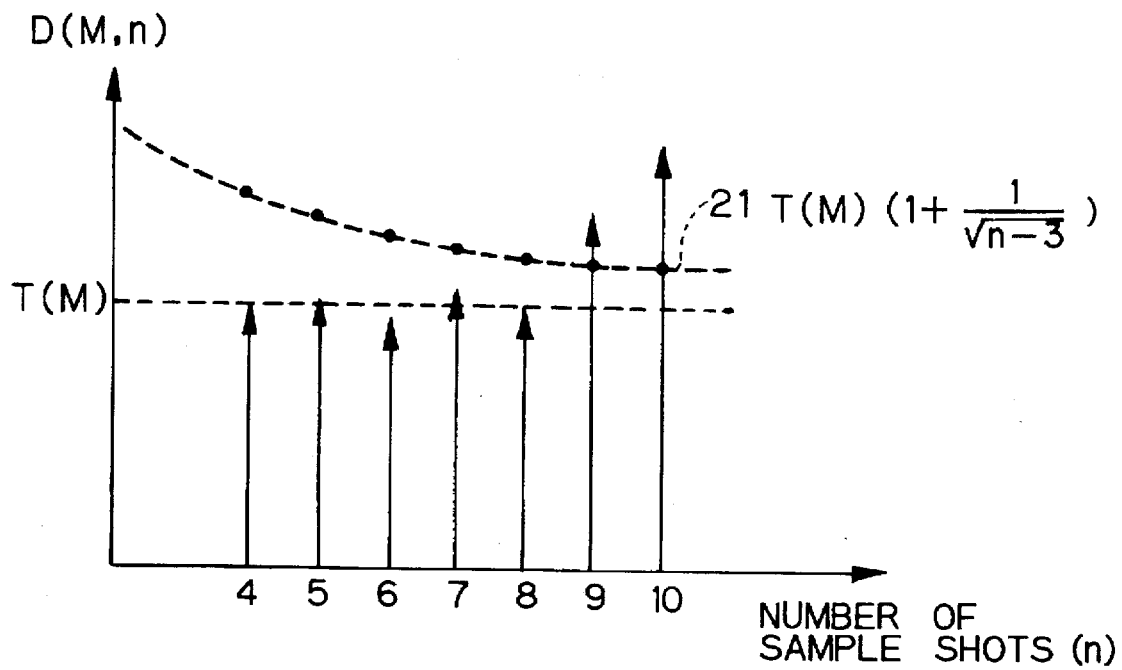
FIG. 23(a) is a diagram showing the relationship of the evaluation function D(M, n) of the dispersion of the non-linear error component to the number of sample shots, n, in the shot array shown in FIGS. 21(a) to 21(c)

In FIG. 23(a), the M group of evaluation functions D(M, n), obtained with respect to ten sample shots of FIG. 21(a), are plotted with arrows with respect to the number n of remaining sample shots. If the evaluation functions D(M, n) of FIG. 23(a) are simply compared with the average values T(M), the probability that sample shots other than jump shots are considered jump shots will become high. Then, based on the fact that the reliability of the evaluation function D(M, n) is high when the number n of sample shots is large, and by a threshold value, $T(M)\{1+1/(n-3)^{1/2}\}$, expressed with a broken line 21 of FIG. 23(a), the dispersion of the nonlinear component is included in that threshold value, and jump shots in which the dispersion thereof is greater than Gaussian distribution are considered to have been removed at the time that the evaluation function D(M, n) has become less than the broken line 21. In an example of FIG. 23(a), since the evaluation function D(M, n) is less than the broken line 21 when the number n of remaining sample shots is 8, the number of sample shots that are left is 8, i.e., the number of jump shots is two.

Figure 23B:
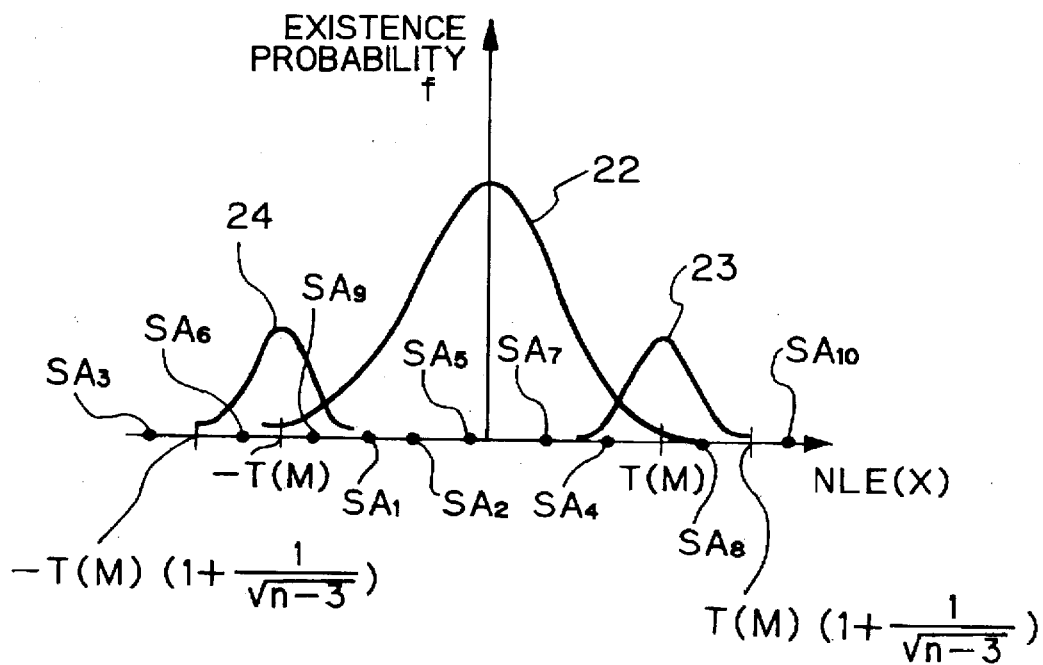
FIG. 23(b) is a diagram showing the existence probability of a sample shot to the X component of a nonlinear error component.

FIG. 23(b) shows that sample shots $SA_3$ and $SA_{10}$ exist outside a range which includes nonlinear components changing according to Gaussian distribution and includes dispersions. The axis of abscissas of FIG. 23(b) represents the nonlinear error component NLE(X) of each sample shot in the X direction, and the axis of ordinates represents an existence probability f at that nonlinear error component NLE(X). A curve 22 indicates Gaussian distribution, and curves 23 and 24 having average values T(M) and –T(M) at the centers thereof represents existence probability where dispersions are taken into consideration according to the number of sample shots, respectively. The nonlinear error components NLE(X) of the sample shots $SA_3$ and $SA_{10}$ are removed as jump shots, because they are outside the curves 23 and 24.

Also, FIG. 23(a) expresses an M Group of evaluation functions D(M, n), but Graphs similar to FIG. 23(a) exist when a value of m changes from 1 to N, and among the Graphs, the Graph where the average value T(m) becomes minimum is FIG. 23(a).

Figure 22A:
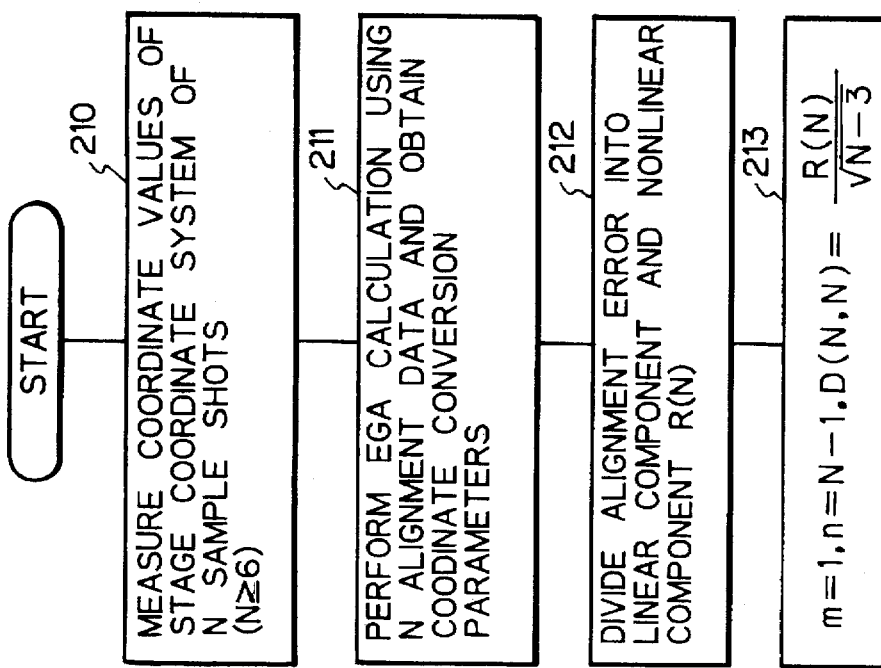
Figure 22B:
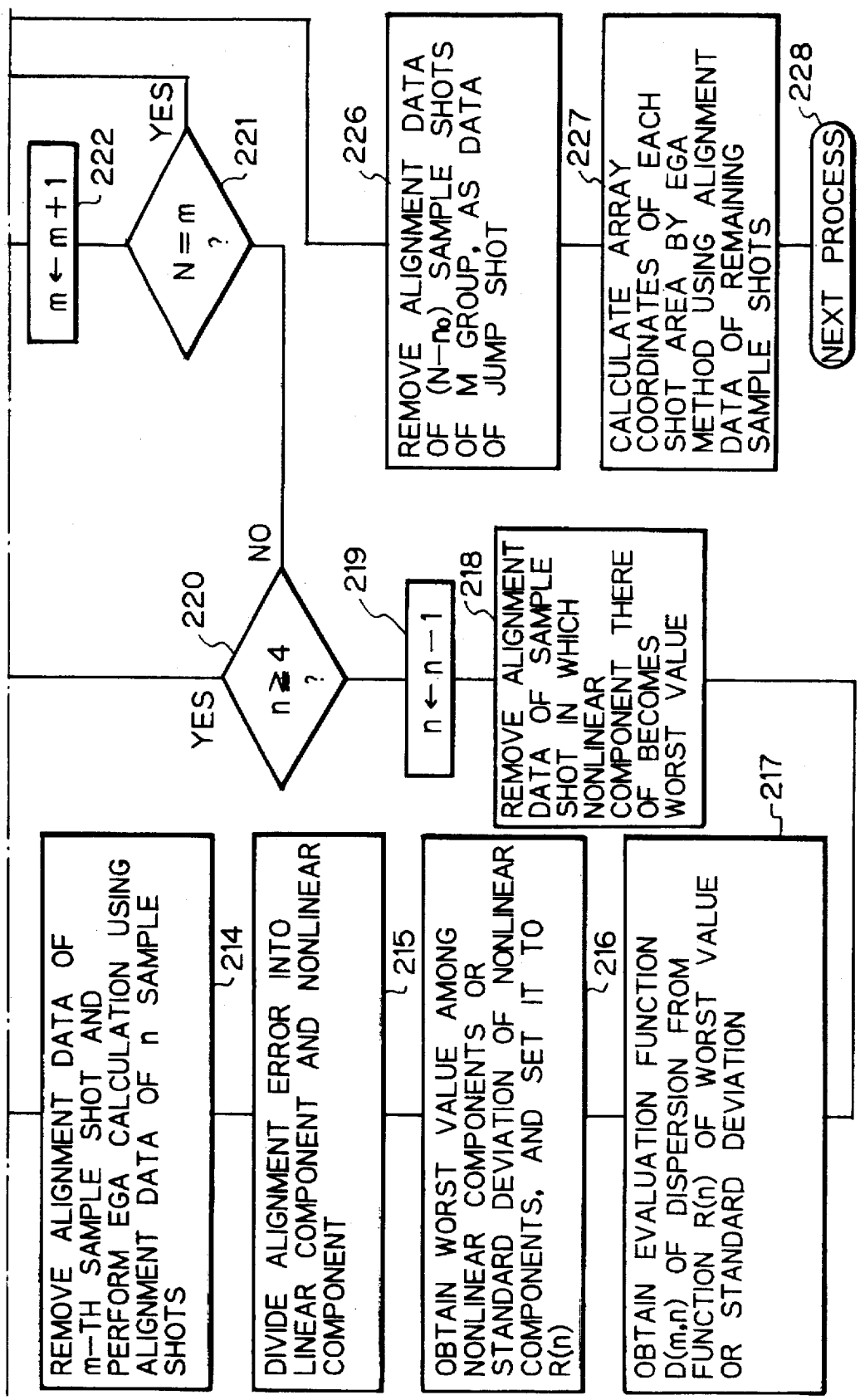

Note that, in the above-described embodiment, as shown in a flowchart of FIGS. 22 and 22B, the m-th sample shot is first removed, then sample shots in which the nonlinear error component thereof is larger are gradually removed, and finally the evaluation functions D(m, n) are obtained by repeating EGA calculation. Instead of this method, sample shots in which the nonlinear error component thereof is larger may be removed as jump shots, after the m-th sample shot is first removed and the conversion parameters of Equation (1) are calculated. This method can reduce a quantity of calculation but, in the above-described fourth embodiment, jump shots can be detected more accurately.

While, in the above-described fourth embodiment, the TTL type or off-axis type alignment system has been used as an alignment system, a through-the-reticle type alignment system may be used. Also, although a single wafer mark for X-axis and a single wafer mark for Y-axis have been provided according to the fourth embodiment in each sample shot, three or more wafer marks may be provided in each sample shot. In addition, all wafer marks of each sample shot do not always need to be measured.

In addition, while the present invention has been applied to the above-described fourth embodiment where wafer alignment is performed with an exposure apparatus, the invention may be applied, for example, to a case where vernier evaluation is performed with an exposure apparatus. This vernier evaluation is a method in which first marks for measurement are transferred on a plurality of shot areas on a wafer, then second marks for measurement are transferred over the first marks by a second exposure, a quantity of offset between the first and second marks is measured on a selected shot area (sample shot) on the wafer after development, and finally the characteristic of the array registration of the shot area is evaluated from the quantity of offset. In such a case, if, based on the measurement result of the first selected sample shot, a sample shot in which the nonlinear component thereof is greater is removed according to the present invention, various characteristics will be evaluated more accurately.

In accordance with the first alignment method of the present invention, a single sample area (sample shot) in which the nonlinear component thereof is largest is removed in sequence, and for the remaining sample areas, evaluation values are obtained from the dispersions of the nonlinear error components, respectively. Then, a sample shot (jump shot) in which the nonlinear error component thereof is larger is removed until the evaluation value becomes less than a threshold value corresponding to an average value of the evaluation value. Therefore, the first alignment method has the advantage that a jump shot can be removed with reliability and alignment can be performed with accuracy.

Also, since the threshold value has been obtained from a plurality of evaluation values corresponding to the number of sample areas, there is the advantage that a reference for detecting a jump shot can automatically be set. In addition, the position of a sample area can be determined according to the state of a substrate (wafer) by adjusting the number of sample areas to be actually measured according to the size of the threshold value.

In such a case, if the threshold value is set to an average value of a plurality of evaluation values, calculation will become easy. Also, in a case where the threshold value is a value obtained by adding a dispersion of a plurality of evaluation values to an average value of the evaluation values, there is only a small possibility that a sample area which is not a jump shot is removed as a jump shot by mistake.

In addition, in accordance with the second alignment method of the present invention, each dispersion of the nonlinear error components, obtained for remaining sample regions, is compared with a predetermined function in order to remove a jump shot. Therefore, the second alignment method, as with the first alignment method, has the advantage that a jump shot can be removed with reliability and alignment can be performed with accuracy. At this time, when the predetermined function is proportional to $\{n(n-3)\}^{1/2}$, this method is effective when an error is a Gaussian distribution.

Furthermore, the surface condition of a substrate is detected according to the second alignment method of the present invention. Therefore, there is the advantage that a jump shot can be quickly removed without actually measuring the array coordinates of areas to be processed (sample shots).

In accordance with the fourth alignment method of the present invention, a sample area (jump shot) where the nonlinear error component thereof is largest can be specified accurately. Therefore, when alignment is performed with a statistical processing method such as an EGA method by removing that jump shot, there is the advantage that the influence of the jump shot is alleviated and the areas to be processed (shot areas) of a substrate (wafer) can be set to predetermined exposure positions accurately.

Also, since values T1(m), obtained by standardizing the dispersions of the nonlinear error components with an average value, are mutually compared and then a jump shot is specified, an evaluation reference for specifying a jump shot is automatically determined. As a result, a jump shot can be specified with accuracy.

Furthermore, in a case where values T2(m1, m2), obtained by standardizing the dispersions of the first two nonlinear error components with an average value of the dispersions of the remaining nonlinear error components, are mutually compared, there is the advantage that the two jump shots can be accurately specified, even when two jump shots exist.

Moreover, by mutually comparing the above-described value T1(m) and value T2(m1, m2), there is the advantage that whether the number of jump shots is one or two can be determined accurately.

In a case where a jump shot is removed and then the array coordinates of the processing regions are calculated, alignment as a whole can be accurately performed particularly when the nonlinear error component of the jump shot is large.

On the other hand, in a case where a small weight is applied to a jump shot and then the array coordinates of the areas to be processed are calculated, particularly when the nonlinear error component of the jump shot is not too large there is the advantage that the influence of the jump shot is alleviated and stable alignment can be performed considering the measurement result of the jump shot to some degree.

In such a case, weighting can be accurately performed by using values corresponding to the reverse number of the above-described value T1(m) and the reverse number of the above-described value T2(m1, m2).

In accordance with the fifth alignment method of the present invention, the respective dispersions of the nonlinear error components of all sample areas are obtained using the transformation parameters obtained by removing a single sample area in sequence, and a sample area, which has been removed when the conversion parameters are obtained as the dispersion becomes largest, is assumed to be a jump shot. Therefore, the jump shot is accurately specified using the transformation parameters which are not influenced by the value of the jump shot itself. Thereafter, a light weight is applied, for example, to the measured data of the jump shot, and the array coordinates of each processing region are calculated with all the measured data by statistical processing, thereby reducing the influence of the jump shot.

In accordance with the sixth alignment method of the present invention, first a sample area where the nonlinear error component thereof is large is specified as a jump area (jump shot). Thereafter, light weight is applied, for example, to the measured data of the jump shot, and the array coordinates of each area to be processed are calculated with all the measured data by statistical processing, thereby reducing the influence of the jump shot.

In accordance with the seventh alignment method of the present invention, after the m-th sample area (sample shot) is first removed, sample areas where the nonlinear error component thereof is larger are removed in sequence and then respective nonlinear error components are obtained. Therefore, there is the benefit that a jump shot can be removed accurately. As a result, the calculation of the linear error component as alignment is performed by an EGA method can be executed with a high degree of accuracy, and alignment accuracy is enhanced.

Also, the seventh alignment method of the present invention is particularly effective when the number of jump shots is 2or less, because an average value of the dispersions D(m, n) of (N–2) sample areas is obtained. However, when the number of jump shots is, for example, three, a combination of sample areas which are removed in sequence until the number of sample shots reaches (N–2) can be changed. In such a case, the number of combinations is increased to N·(N–1), but the jump shots can be removed accurately.

What is claimed is:

1. A method for aligning each of a plurality of areas on a substrate with respect to a predetermined position on a coordinate system prescribing a moving position of said substrate, comprising the steps of:

(1) detecting a surface condition of said substrate in N sample areas (where N is an integer of 4 or more) among said plurality of areas;

(2) selecting a plurality of sample areas from among said N sample areas on the basis of said detected surface condition so that coordinate positions of said selected sample areas are measured; and (3) determining the coordinate position on said coordinate system of each of said plurality of areas on the basis of the measured coordinate position.

2. A method according to claim 1, further comprising:

a step of moving said substrate on the basis of said determined coordinate position and then exposing each of said plurality of areas with a pattern image on a mask.

3. A method for aligning each of a plurality of areas on a substrate with respect to a predetermined position on a coordinate system prescribing a moving position of said substrate, comprising the steps of:

(1) measuring coordinate positions on said coordinate system of N sample areas (where N is an integer) among said plurality of areas;

(2) obtaining a nonlinear error component of said measured coordinate position for each of said N sample areas by using said measured coordinate positions;

(3) obtaining an evaluation value AN for a dispersion of said N nonlinear error components which correspond to number N of said sample areas;

(4) by using the measured coordinate positions of (N-m) sample areas (where m is an integer having an initial value 1) in which a sample area having the largest nonlinear error component is excluded from said N sample areas, obtaining a nonlinear error component for each of said (N-m) sample areas and obtaining an evaluation value (AN-m) of a dispersion of said (N-M) nonlinear error components corresponding to the number (N-m) of said sample areas, said step (4) being repeated until said (N-m) becomes a predetermined value with said integer being increased one-by-one from 1; and (5) determining a plurality of sample areas which are used for calculating the coordinate positions on said coordinate system of each of said plurality of areas on said substrate, by comparing each of evaluation values obtained by said steps (3) and (4) with a predetermined threshold value.

4. A method according to claim 3, wherein said predetermined threshold value is an average value of said plurality of evaluation values obtained by said steps (3) and (4).

5. A method according to claim 3, wherein said predetermined threshold value is the sum of an average value of said plurality of evaluation values obtained by said steps (3) and (4) and the dispersion of said evaluation values.

6. A method according to claim 3, further comprising a step of:

exposing each of said plurality of areas on said substrate with a pattern image on a mask by statistically processing the coordinate positions of the sample areas determined in said step (5) to calculate a coordinate position on said coordinate system of each of the plurality of areas on said substrate and by moving said substrate on the basis of said calculated coordinate positions.

7. A method for aligning each of a plurality of areas on a substrate with respect to a predetermined position on a coordinate system prescribing a moving position of said substrate, comprising the steps of:

(1) measuring coordinate positions on said coordinate system of n sample areas among said plurality of areas;

(2) obtaining a nonlinear error component of said measured coordinate positions for each of said n sample areas by using said measured coordinate positions;

(3) evaluating said obtained n nonlinear error components on the basis of the number n of said sample areas; and (4) determining, on the basis of said evaluation, whether or not the measured coordinate position of said sample area in which said nonlinear error component is maximum is used when the coordinate position on said coordinate system for each of a plurality of areas on said substrate is calculated.

8. A method according to claim 7, wherein said evaluation of said n nonlinear error components is carried out on the basis of reliability of at least one of said nonlinear error components defined by the number n of said sample areas and an effect by averaging said nonlinear error components defined by the number n of said sample areas.

9. A method for aligning each of a plurality of areas on a substrate with respect to a predetermined position on a coordinate system prescribing a moving position of said substrate, comprising the steps of:

(1) measuring coordinate positions on said coordinate system of N sample areas (where N is an integer) among said plurality of areas;

(2) obtaining a nonlinear error component of said measured coordinate position for each of said N sample areas on the basis of said measured coordinate positions;

(3) obtaining dispersion of said N nonlinear error components corresponding to the number N of said sample areas;

(4) by using the measured coordinate positions of (N-m) sample areas (where m is an integer having an initial value 1) in which a sample area having the largest nonlinear error component is excluded from said N sample areas, obtaining a nonlinear error component for each of said (N-m) sample areas and obtaining dispersion of said (N-m) nonlinear error components corresponding to the number (N-m) of said sample areas, said step (4) being repeated until said (N-m) becomes a predetermined value with said integer being increased one-by-one from 1;

(5) determining a plurality of sample areas which are used for calculating coordinate positions on said coordinate system of each of said plurality of areas on said substrate, by comparing each of said dispersions obtained in said steps (3) and (4) with a predetermined function.

10. A method according to claim 9, wherein said predetermined function is the product of a predetermined constant and $(n(n-3))^{1/2}$, wherein n is the number of sample areas to be calculated.

11. A method according to claim 9, further comprising a step of:

exposing each of said plurality of areas on said substrate with a pattern image on a mask by statistically processing the coordinate positions of the sample areas determined in said step (5) to calculate a coordinate position on said coordinate system for each of the plurality of areas on said substrate and by moving said substrate on the basis of said calculated coordinate positions.

12. A method for aligning each of a plurality of areas on a substrate with respect to a predetermined position on a coordinate system prescribing a moving position of said substrate, comprising the steps of:

(1) measuring coordinate positions on said coordinate system of N sample areas (where N is an integer of 6 or more) among said plurality of areas;

(2) obtaining a nonlinear error component of each of (N-1) sample areas and dispersion D(m,N-1) of (N-1) nonlinear error components by using (N-1) coordinate positions in which the m-th sample area (where m is an integer from 1 to N) is excluded from the measured coordinate positions;

(3) excluding a sample area in which the obtained nonlinear error component is largest and obtaining a nonlinear error component for each of n sample areas (n is an integer form (N-2) to a predetermined value) and dispersion D(m,n) of n nonlinear error components, said step (3) being repeated until said n becomes a predetermined value with said n being decreased one-by-one from (N-2);

(4) obtaining an average value T(m) of the dispersion D(m,n) obtained in step (3);

(5) obtaining N average values T(m) by repeating steps (2) to (4) until said integer m becomes N with said integer m being increased one-by-one from 1; and (6) comparing each of the dispersions D(M,N-1) and D(M,n) obtained in said steps (2) and (3) with a predetermined value, wherein m providing the smallest average value among said obtained N average values T(m) is defined as M, and determining a plurality of sample areas which are used for calculating coordinate position on said coordinate system of each of the plurality of areas on said substrate.

13. A method according to claim 12, further comprising a step of:

exposing each of said plurality of areas on said substrate with a pattern image on a mask by statistically processing the coordinate positions of the sample areas determined in said step (6) to calculate the coordinate position on said coordinate system of each of the plurality of areas on said substrate and by moving said substrate on the basis of said calculated coordinate position.

14. A method for aligning each of a plurality of areas on a substrate with respect to a predetermined position on a coordinate system prescribing a moving position of said substrate, comprising the steps of:

(1) measuring coordinate positions on said coordinate system of N sample areas (where N is an integer of 6 or more) among said plurality of areas;

(2) obtaining a nonlinear error component for each of (N–1) sample areas and dispersion B(m,N–1) of (N–1) nonlinear error components by using (N–1) coordinate positions in which the m-th sample area (where m is an integer having an initial value 1) is excluded from the measured N sample areas;

(3) excluding a sample are in which the obtained nonlinear error component is largest and obtaining nonlinear error component for each of n sample areas and dispersion B(m,n) of said n nonlinear error components, said step (3) being repeated until said n becomes a predetermined value with said n being decreased one-by-one from (N–2);

(4) repeating steps (2) and (3) until said m becomes N with said m being increased one-by-one from 1 and obtaining N values T1 (m) which correspond to each of the integer m and in which the dispersion B(m,N–1) is standardized with an average value of dispersions obtained in said steps (3) and (4); and (5) determining a plurality of sample areas which are used for calculating a coordinate position on said coordinate system for each of the plurality of areas on said substrate on the basis of the N standardized values T1(m) obtained in said step (4).

15. A method according to claim 14, wherein, in step (4), N values T2(m) in which the dispersion B(m,N–2) is standardized with the average value of the dispersions obtained in said steps (2) and (3) is obtained corresponding to each of the integer m, and wherein, in the step (5), the plurality of sample areas which are used for calculating a coordinate position on said coordinate system for each of a plurality of areas on said substrate is determined on the basis of said N standardized values T1(m) and N standardized values T2(m).

16. A method according to claim 15, further comprising the steps of:

detecting two sample areas corresponding to the maximum value among said N standardized values T2(m) as a sample area in which the nonlinear error component is large; and weighting the coordinate positions of two detected sample areas with a value corresponds to inverse number of said maximum value and weighting each of the other (N–1) sample areas so that the weight for the detected two sample areas becomes small, to calculate the coordinate position on said coordinate system for each of the plurality of areas on said substrate on the basis of the N weighted coordinate positions.

17. A method according to claim 15, further including a step of:

exposing each of said plurality of areas on said substrate with a pattern image on a mask by statistically processing the sample areas determined in said step (5) to calculate a coordinate position on said coordinate system of each of the plurality of areas on said substrate and by moving said substrate on the basis of said calculated coordinate position.

18. A method according to claim 14, wherein the number of coordinate positions which are not used for calculating the coordinate position on said coordinate system for each of a plurality of areas on said substrate among the coordinate positions of said N sample areas is determined on the basis of said N standardized values T1(m) and N standardized values T2(m).

19. A method according to claim 14, wherein, in step (5), at least one of sample area in which the nonlinear component is large is deleted by comparing N standardized values T1(m) with each other, and a coordinate position on said coordinate system for each of the plurality of areas on said substrate is calculated on the basis of the coordinate positions of the sample areas in which at least one detected sample area.

20. A method according to claim 14, wherein, in said step (5), at least one of sample area in which nonlinear component is large is detected by comparing N standardized values T1(m) with each other, each of the coordinate positions of said N sample areas is weighted so that the weight given to the coordinate position of at least one detected sample area becomes small, and coordinate position on said coordinate system for each of the plurality of areas on said substrate is calculated on the basis of said weighted N coordinate positions.

21. A method according to claim 14, further comprising the steps of:

detecting a sample area corresponding to maximum value among said N standardized values T1(m) as a sample area in which the nonlinear error component is large; and weighting the coordinate positions of one detected sample area with a value corresponds to an inverse number of said maximum value and weighting each of the other (N–1) sample areas so that the weight for the detected sample area becomes small, to calculate the coordinate position on said coordinate system for each of the plurality of areas on said substrate on the basis of the N weighted coordinate positions.

22. A method for aligning each of a plurality of areas on a substrate with respect to a predetermined position on a coordinate system prescribing a moving position of said substrate, comprising the steps of:

(1) detecting coordinate positions on said coordinate system of N sample areas (wherein N is an integer of 6 or more) among said plurality of areas;

(2) obtaining a nonlinear error component for each of (N–1) sample areas and dispersion B(m,N–1) of (N–1) nonlinear error components on the basis of (N–1) coordinate positions in which the m-th sample area (where m is an integer having an initial value 1) is excluded from the measured N sample areas, said step (2) being repeated until said integer m becomes N with said integer being increased one-by-one from 1 in order to obtain N dispersions B(m,N–1); and (3) determining a plurality of sample areas which are used for calculating coordinate positions on said coordinate system of each of the plurality of areas on said substrate by comparing N dispersions B(m,N–1) obtained in said step (2) with each other.

\* \* \* \* \*